(12) United States Patent
Debije et al.

(10) Patent No.: US 8,475,033 B2
(45) Date of Patent: Jul. 2, 2013

(54) LUMINESCENT OBJECT COMPRISING ALIGNED POLYMERS HAVING A SPECIFIC PRETILT ANGLE

(75) Inventors: Michael G. Debije, Eindhoven (NL); Cees W. M. Bastiaansen, Eindhoven (NL); Dick J. Broer, Eindhoven (NL); Michael J. Escuti, Raleigh, NC (US); Carlos Sanchez, Saragossa (ES)

(73) Assignee: Koninklijke Philips Electronics N.V., Eindhoven (NL)

( * ) Notice: Subject to any disclaimer, the term of this patent is extended or adjusted under 35 U.S.C. 154(b) by 934 days.

(21) Appl. No.: 11/816,404

(22) PCT Filed: Feb. 16, 2006

(86) PCT No.: PCT/NL2006/050029
§ 371 (c)(1),
(2), (4) Date: Sep. 12, 2008

(87) PCT Pub. No.: WO2006/088370
PCT Pub. Date: Aug. 24, 2006

(65) Prior Publication Data
US 2009/0027872 A1    Jan. 29, 2009

(30) Foreign Application Priority Data

Feb. 16, 2005 (EP) ..................... 05075375
Feb. 16, 2005 (EP) ..................... 05075376

(51) Int. Cl.
*F21V 7/04* (2006.01)
(52) U.S. Cl.
USPC ............ 362/615; 362/601; 362/606; 362/607

(58) Field of Classification Search
USPC ............... 362/2, 600–634, 551–581, 34, 510, 362/511, 166, 230, 231, 293
See application file for complete search history.

(56) References Cited

U.S. PATENT DOCUMENTS

| 4,505,264 | A |   | 3/1985  | Tremblay |
|-----------|---|---|---------|----------|
| 4,812,013 | A |   | 3/1989  | Aurouet et al. |
| 5,164,111 | A | * | 11/1992 | Dorsch et al. ............ 252/299.01 |
| 5,853,240 | A | * | 12/1998 | Tanaka et al. ................. 359/631 |
| 5,877,874 | A |   | 3/1999  | Rosenberg |
| 6,734,936 | B1|   | 5/2004  | Schadt |
| 2002/0012156 | A1 | * | 1/2002 | Varaprasad et al. .......... 359/273 |
| 2002/0025113 | A1 | * | 2/2002 | Wang et al. ..................... 385/31 |

(Continued)

FOREIGN PATENT DOCUMENTS

| DE | 27 37 847 A1 | 3/1979 |
| EP | 0 608 924 A  | 8/1994 |
| EP | 0 933 655 A  | 8/1999 |
| WO | 2004-025337 A1 | 3/2004 |

*Primary Examiner* — William Carter

(57) ABSTRACT

A first aspect of the invention relates to a luminescent object comprising an aligned polymer that contains an oriented photoluminescent material, said aligned polymer having a pretilt angle of 10-90°. The luminescent object according to the present invention may advantageously be employed in luminescent solar concentrator systems as it enables highly efficient transportation of radiation emitted by the photoluminescent material following exposure to incident solar light. Another aspect of the invention concerns a photovoltaic device comprising an electromagnetic radiation collection medium containing the aforementioned luminescent object and a photovoltaic cell capable of converting optical radiation to electrical energy which is optically coupled to the luminescent object. Further aspects of the invention include a fluorescent light activated display and a room lighting system comprising the aforementioned luminescent object.

27 Claims, 8 Drawing Sheets

U.S. PATENT DOCUMENTS

| | | |
|---|---|---|
| 2004/0105617 A1 | 6/2004 | Cornelissen et al. |
| 2004/0135494 A1* | 7/2004 | Miyatake .................. 313/501 |
| 2005/0040757 A1* | 2/2005 | Chen et al. ................ 313/504 |
| 2005/0214479 A1* | 9/2005 | Erben et al. ................ 428/1.1 |
| 2006/0113885 A1* | 6/2006 | Iimura ........................ 313/485 |

* cited by examiner

LUMINESCENT OBJECT COMPRISING ALIGNED POLYMERS HAVING A SPECIFIC PRETILT ANGLE

TECHNICAL FIELD OF THE INVENTION

The present invention relates to a luminescent object and in particular to the application of such a luminescent object in optical luminescent concentrator devices, such as luminescent solar concentrator devices.

BACKGROUND OF THE INVENTION

The cost of solar energy per unit Watt is approximately 5-10 times higher than energy from other sources, which include coal, oil, wind, biomass and nuclear. In order to reduce the cost of solar energy generation in photovoltaic systems, it is desirable to make efficient use of the most expensive part of the system, namely the photovoltaic cell (solar cell). Conventionally, this is done by using large light-focusing solar concentrators (parabolic or trough dishes). These devices have several disadvantages, including high investment cost, high maintenance cost, unwieldy shapes, and the necessity of tracking the sun as it crosses the sky: for a review of current state of the art, see Swanson, Progress in Photovoltaics: Research and Applications 8, 93 (2000).

An alternative option that has been the subject of investigations is to use a waveguide that collects the light and transports it to a small photovoltaic cell. Some of these efforts attempted to use holographic means (U.S. Pat. No. 5,877, 874) or geometrical optics to redirect the light (see for example T. Uematsu et al Sol Energ Mater Sol C 67, 415 (2001) and U.S. Pat. No. 4,505,264). These attempts were rather unsuccessful, especially for large transport distances because the efficiencies were low or the systems require tracking of the sun or the systems were complex and not suitable for large-scale production or combinations thereof.

Luminescent solar concentrators (LSC) represent another alternative that has been the subject of investigations, predominantly because these systems are easy to produce at low cost and because these systems do not require tracking of the sun. LSCs consist basically of a large glass or polymeric plate, sheet, film, fibre, ribbon, woven or coating which is doped with fluorescent dye molecules. The dyes absorb light of specific wavelengths from the solar light incident upon it, and re-emit the light in all directions at a longer wavelength. A portion of this light is emitted within the critical angle of the supporting waveguide, and is totally internally reflected and transported to the photovoltaic cell. The LSC has the advantage of combining less expensive materials with flexibility (especially when a plastic waveguide is used) without the need of a heat sink or a sun tracking system. A sample system with a different purpose (room lighting) is described in Earp et al, Sol Energ Mat Sol C 84, 411 (2004). At the moment, LSC-systems are not used commercially which is predominantly related to their poor efficiency. This low overall efficiency originates from a high reabsorption of emitted light (limited Stokes Shift of the dye), from a poor efficiency of coupling light into the waveguide and from a poor efficiency in keeping the light within the waveguide.

The present invention aims to remedy these drawbacks of LSC-systems, in particular by providing means of increasing the efficiency with which emitted light is coupled into the waveguide.

SUMMARY OF THE INVENTION

The inventors have discovered that the efficiency of LSC-systems can be increased dramatically by employing therein an aligned polymer that contains an oriented photoluminescent material. In accordance with the present invention alignment of the polymer is used to induce the orientation of the photoluminescent material. Radiation emitted by non-aligned, isotropic photoluminescent material travels in all directions, with slight preference for an emission direction perpendicular to the LSC-system for incident illumination perpendicular to the plane of the LSC-system. In other words, a large fraction of the light is emitted outside the waveguiding mode and is not transported within the waveguide. The proper alignment of the photoluminescent material within the polymer ensures that a large fraction of the light emitted by the oriented photoluminescent material is radiated into the waveguiding mode of the LSC-system.

Thus, in case of alignment at a significant pretilt angle, radiation will be emitted at an angle that allows it to be coupled very effectively into a waveguide. In the case of alignment at a large pretilt angle $\alpha$ relatively large fraction of the emitted radiation will meet the luminescent object's interface with air with an angle greater than the critical angle of total reflection and remain inside the object. Consequently, the use of aligned photoluminescent material makes it possible to contain a much higher fraction of the emitted light within a LSC-system than was feasible up until now. As a result, the present invention makes it possible to increase the operating efficiency of LSC systems by more than 25%.

Accordingly, one aspect of the invention relates to a luminescent object comprising an aligned polymer that contains an oriented photoluminescent material, said aligned polymer having a pretilt angle of 10-90° relative to the surface of the object. In a specific embodiment, the invention is directed to a luminescent object comprising a luminescent layer and a waveguide, wherein the object is an optical laminate or an optical fibre, the luminescent object being coupled optically to the waveguide, the luminescent object comprising an aligned polymer that contains an oriented photoluminescent material, said oriented photoluminescent material being immobilized within the aligned polymer, and said aligned polymer having a pretilt angle of 10-89°, preferably 10-90°, more preferably 10-85°, even more preferably 15-85°, yet even more preferably 30-80°, more preferably 30-70°, yet even more preferably 40-70°, relative to the surface of the object.

This luminescent object may be used to convert incident light into light of a longer wavelength. In case the emitted light is radiated at a relatively small angle relative to the surface of the object (requiring the use of a relatively high pretilt angle), the emitted light can be transported efficiently within the plane parallel to said surface to, for instance, an exit or a photovoltaic device. Thus, the present film can be applied as such, without a separate waveguide, in e.g. LSCs. In this particular case it is very advantageous to use photoluminescent materials with a large Stokes Shift and/or with little overlap between the absorption and emission spectra to avoid large light losses by re-absorption phenomena.

The luminescent object according to the invention can also advantageously be coupled optically to a (transparent) waveguide (without fluorescent dyes) as the efficiency of transfer (or in-coupling) of emitted light into the waveguide is greatly enhanced by the present invention, especially if the photoluminescent material is oriented at a pretilt angle within the range of 30-70°. The optical coupling of the present luminescent object can suitably be achieved by producing a multi-layer structure (e.g. an optical laminate or a multi-layer optical fibre) in which the luminescent object is bonded as a separate layer onto the waveguide.

Liquid crystalline homeotropically oriented polymer films comprising at least one dichroic dye have been described in EP-A 0 608 924. The homeotropic orientation along with the presence of dichroic dye is said to make it possible to employ a different technique for writing out and reading data. The European application does not contain any reference to dichroic photoluminescent dyes. Moreover, this patent application does not include aligned dyes with a pretilt below 90°.

Definitions

The term "luminescent" as used herein refers to the capability of a material to emit light upon absorption of light or other radiation of sufficient quantum energy. The term includes both fluorescence and phosphorescence.

The term "light" as used herein refers to optical radiation which may be visible or invisible to the human eye.

The term "optical radiation" refers to electromagnetic radiation in the wavelength range between 100 nm and 2000 nm.

The term "photoluminescence" as used herein refers to luminescence generated by the absorption of light.

The term "photoluminescent material" as used herein refers to atoms or molecules, including ions that are capable of photoluminescence. The term "photoluminescent material" also encompasses combinations of two or more different photoluminescent components, e.g. combinations of two or more different photoluminescent molecules. The term "photoluminescent material" also encompasses guest-host systems comprising a fluorescent molecule, fluorescent polymers and/or co-polymers.

The terms "aligned" and "oriented" as used herein in relation to polymers, photoluminescent materials or to groups contained in these polymers or materials, are synonyms and indicate that amongst these polymers, materials or groups a particular spatial orientation is prevailing.

By the terminology "aligned polymer having a pretilt angle of 10-90°" it is meant that the mesogenic groups of the aligned polymer are oriented at a pretilt angle of at least 10-90° relative to the surface of the luminescent object.

The term "liquid crystal" or "mesogen" is used to indicate materials or compounds comprising one or more (semi-) rigid rod-shaped, banana-shaped, board-shaped or disk-shaped mesogenic groups, i.e. groups with the ability to induce liquid crystal phase behaviour. Liquid crystal compounds with rod-shaped or board-shaped groups are also known in the art as 'calamitic' liquid crystals. Liquid crystal compounds with a disk-shaped group are also known in the art as 'discotic' liquid crystals. The compounds or materials comprising mesogenic groups do not necessarily have to exhibit a liquid crystal phase themselves. It is also possible that they show liquid crystal phase behaviour only in mixtures with other compounds, or when the mesogenic compounds or materials, or the mixtures thereof, are polymerized.

For the sake of simplicity, the term "liquid crystal material" is used hereinafter both to describe liquid crystal materials and mesogenic materials, and the term 'mesogen' is used for the mesogenic groups of the material. The compounds or materials comprising mesogenic groups do not necessarily have to exhibit a liquid crystal phase themselves. It is also possible that they show liquid crystal phase behaviour only in a definite (polymerised) layer, e.g. a coating layer on a waveguide (see below).

The term "liquid crystalline monomer" as used herein refers to a material which can undergo polymerization thereby contributing constitutional units to the essential structure of a liquid crystalline polymer.

The term "reactive liquid crystalline monomer" as used herein refers to a liquid crystalline monomer that contains a reactive group that can be polymerized to form a liquid crystalline polymer or liquid crystalline polymeric network.

The term "liquid crystalline polymer" as used herein refers to a polymer material in a mesomorphic state having long-range orientational order and either partial positional order or complete positional disorder (IUPAC Recommendations 2001; Pure Appl. Chem. (2002) 74(3), 493-509).

The term "polymer layer" as used herein encompasses polymeric materials in the form of sheets, strips, bands, fibres, ribbons, woven and strands. The invention is not restricted to flat polymer layers and includes polymer layers that have been bent, moulded or otherwise shaped, provided the aligned polymer within the polymer layer is oriented at a pretilt angle relative to the surface of the object as defined above.

The term "waveguide" as used herein refers to optical components that are transparent to light and that confine optical radiation from an input to a desired output.

The term "transparent" as used herein means that a material transmits most incident solar light and/or light emitted by the photoluminescent material. More particularly, the term "transparent" means that said material transmits at least 50%, preferably at least 60%, more preferably at least 70%, and most preferably at least 90% of said light, measured for light incident perpendicular to the surface of the object that is exposed to said incident light.

The term "transparent waveguide" as used herein means that a waveguide transmits most incident solar light and/or light emitted by the photoluminescent material. More particularly, the term "transparent waveguide" means that said waveguide transmits at least 50%, preferably at least 70% of said light measured for light incident perpendicular to the waveguide.

The term "reflective" as used herein means that a material reflects most incident solar light and/or light emitted by the photoluminescent material. More particularly, the term "reflective" means that said material reflects at least 50%, preferably at least 60%, more preferably at least 80% and most preferably at least 90% of said light. The reflectivity of a material is determined for light incident perpendicular to the reflecting surface.

The term "dichroic ratio" as used herein refers to the dichroic ratio derived from polarization selective absorption of the photoluminescent material. The dichroic ratio is derived from absorption measurements using linearly polarized light with the equation below:

$$R = A_{//}/A_{\perp}.$$

In this equation R is the dichroic ratio, $A_{//}$ the absorbance of the sample with the electric field of the incident light aligned parallel to the alignment direction induced by the aligned polymer, and $A_{\perp}$ the absorbance of the sample with the electric field of the incident light aligned perpendicular to the alignment direction induced by the aligned polymer. The dichroic ratio of a photoluminescent material can be determined by means of different techniques well-known in the art, the suitability of which techniques depends on the nature of the photoluminescent material and of the aligned polymer matrix in which it is contained.

The term "polymeric stack" refers to multilayer films containing sub-layers with different refractive indices based on organic (polymeric) materials that exhibit wavelength selectivity, optionally in combination with polarization selectivity: see, for instance, U.S. Pat. No. 6,157,490.

The term "wavelength selective mirror" as used herein refers to mirrors which are transparent at specific wavelengths and reflective at other wavelengths, optionally in combination with polarization selectivity. A variety of such mirrors are known in the literature.

The terminology "cholesteric layer of chiral nematic polymer" refers to a layer comprising polymers whose mesogenic groups are aligned predominantly parallel to the surface of the layer and in which the molecules rotate with respect to each other in a pre-specified direction which is induced by a chiral reactive or non-reactive dopant. These wavelength selective mirrors can be wavelength tuned (see for example Katsis et al (1999) Chem. Mater. 11, 1590)) or bandwidth tuned (see for example Broer et al (1995) Nature 378, 467).

The terms "ordinary refractive index" and "extraordinary refractive index" as used herein refer to the refractive indices of an aligned polymer perpendicular and parallel to the optic axis of the aligned polymer, respectively.

The term "refractive index of the waveguide" refers to the refractive index of the waveguide in the isotropic state. In specific cases, oriented waveguides may be used which exhibit birefringence due to, for instance, flow during the production process.

The phrase "homeotropically aligned photoluminescent polymer coating" refers to a polymeric coating comprising photoluminescent material, wherein the pretilt angle is 90°.

The term "pretilt angle" of the alignment refers to an angle made with the horizontal, for instance the surface of an upper layer, and is known to the person skilled in the art.

Figure 1:
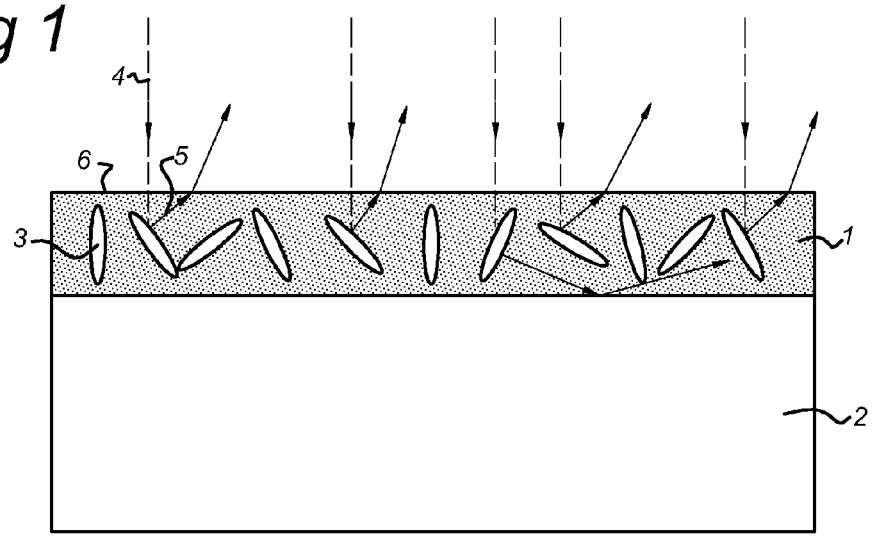
FIG. 1 depicts a cross section of an optical laminate comprising a luminescent layer 1 and a waveguide 2. The luminescent layer 1 contains a plurality of isotropically arranged photoluminescent dye molecules 3. Incident optical radiation 4 enters the luminescent layer 1, where it excites the photoluminescent dye molecules 3 into emitting optical radiation 5 in all directions. As can be seen from FIG. 1 a significant fraction of the emitted radiation leaves the luminescent layer 1 through the top surface 6, thus reducing the efficacy with which the laminate is capable of concentrating the incident radiation.
Figure 2:
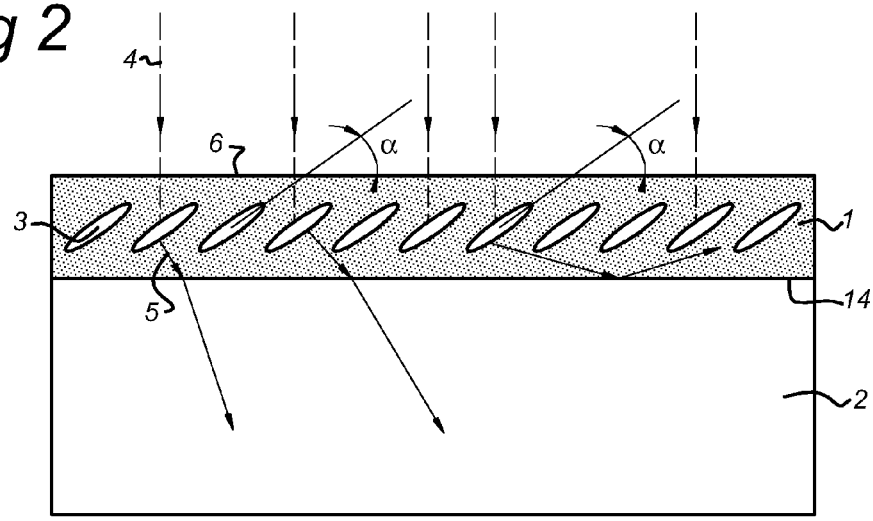
FIG. 2 depicts a cross section of an optical laminate that is identical to the one depicted in FIG. 1, except that the plurality of photoluminescent dye molecules 3 has been aligned at a relatively small angle α of pre-tilt. The photoluminescent dye molecules 3 emit optical radiation 5 largely in a direction perpendicular to the pre-tilt alignment. As shown in the figure radiation is emitted at a relatively large angle relative to interface 14 between the luminescent layer 1 and the waveguide 2, allowing a large fraction of said radiation to be coupled into the waveguide.
Figure 3:
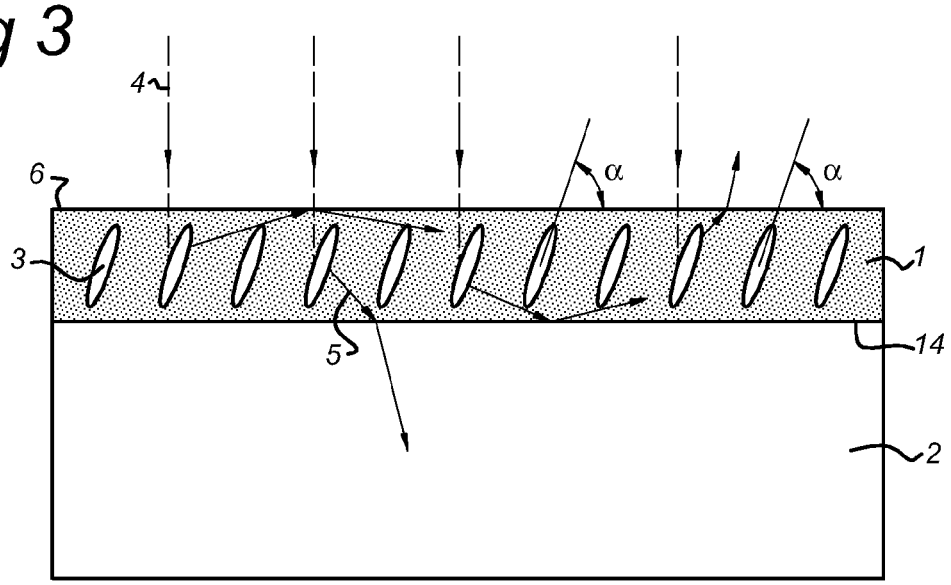
FIG. 3 depicts a cross section of an optical laminate that is identical to the one depicted in FIG. 1, except that the plurality of photoluminescent dye molecules 3 has been tilt-aligned at a relatively large pre-tilt angle α. The photoluminescent dye molecules 3 emit optical radiation 5 largely in a direction perpendicular to the tilt-alignment. Consequently, a significant fraction of the emitted radiation 5 will hit the interface between the luminescent layer 1 and the waveguide 2 at an angle that is well above the reflection angle, meaning that most of this radiation will be reflected at the interface 14 of the luminescent layer 1 and the waveguide 2.

The schematic figures herein do not exclude the presence of other elements like for instance alignment layers to align one or more cholesteric layer(s) or alignment layers to produce the alignment of the aligned polymeric layer(s), as will be clear to the person skilled in the art.

Further, referring to FIGS. 4-6 and 13a-13e, the invention is also direct to embodiments wherein the position of the waveguide 2 and luminescent layer 1 are exchanged. For instance referring to FIG. 4, this would provide a stack with the following sequence: cholesteric layer 8, cholesteric layer 7, waveguide 2, luminescent layer 1, reflective mirror 9 (see FIG. 15a). Referring to for instance FIG. 13a, this would provide a stack with the following sequence: cholesteric layer 8, cholesteric layer 7, waveguide 2, alignment layer 20, luminescent layer 1, reflective mirror 9 (see FIG. 15b). Likewise this applies to the other described and schematically depicted embodiments herein.

DETAILED DESCRIPTION OF THE INVENTION

A luminescent solar cell is also described in DE 2737847, comprising cells containing fluorescent solutions alternated with cells containing gas (air). However, the LSC of DE 2737847 does neither comprise a waveguide nor disclose an oriented photoluminescent material being immobilized within the aligned polymer, wherein the aligned polymer has a pretilt angle of 10-90° relative to the surface of the luminescent object. Hence, the LSC, or more precisely, the luminescent object of DE 2737847 does not provide the herein described advantages of the LSC and luminescent object, respectively.

U.S. Pat. No. 6,734,936 relates to an optical component containing an optically anisotropic layer, which latter has at least two regions with different molecular orientations. The anisotropic layer may, for example, be a retarder layer formed by cross-linked liquid-crystal monomers. This document does neither disclose a waveguide nor disclose the typical alignment according to the present invention.

A first aspect of the invention relates to a luminescent object comprising an aligned polymer that contains an oriented photoluminescent material, said aligned polymer having a pretilt angle of 10-90°. Typically, the photoluminescent material is aligned in essentially the same direction as the mesogenic groups of the aligned polymer. Dichroic photoluminescent materials are particularly suitable for use in accordance with the present invention as they can be oriented relatively easily within a matrix of aligned polymer, e.g. liquid crystalline polymer.

The mesogen can be a reactive mesogen or a non-reactive mesogen. Examples of suitable non-reactive mesogens are those available from Merck™, for example as described in their product folder Licristal® Liquid Crystal Mixtures for Electro-Optic Displays (May 2002) whose contents regarding non-reactive mesogens are incorporated herein by reference.

Examples of suitable reactive mesogens are those comprising acrylate, methacrylate, epoxy, vinyl-ether, styrene, thiol-ene and oxethane groups. Suitable examples are for example described in WO04/025337 whose contents regarding reactive mesogens, referred in WO04/025337 as polymerizable mesogenic compounds and polymerizable liquid crystal materials, are incorporated herein by reference. Also mixtures of reactive mesogens can be used (Merck™ Reactive Mesogens, Brighter clearer communication).

Also mixtures of reactive and non-reactive mesogens can be used. In case of a mixture, all mesogens used are preferably in an aligned state in the final layer.

In the case of liquid crystalline polymers it is advantageous to incorporate and/or dissolve the fluorescent material in a liquid crystalline reactive monomer. These monomers easily align in the presence of a field (flow, magnetic, electrical, poling, mechanical drawing) or in the presence of alignment layers (buffed or non-buffed polyimides, linear photopolymerizable materials, etc.). The pretilt which is generated can be easily controlled by those skilled in the state of the art (see for example Sinha et al (2001) Appl. Phys. Lett. 79, 2543). After the appropriate alignment of the reactive monomer (mixture) a thermal, or radiation induced polymerisation of the liquid crystalline monomer is performed. In specific cases, it is advantageous to add appropriate polymerisation initiators. For instance, in the case of a polymerisation with ultra-violet light a UV-initiator (see for example Irgacure 184, Ciba Specialty Chemicals) is used and in the case of a thermal polymerisation a proper thermal initiator (see for example 2,2'-azobisisobutyronitrile (AIBN), Aldrich Chemicals) is used.

It is possible to discern several kinds of pretilt orientations. According to a typical example of a pretilt orientation, the director of liquid crystal molecules in a liquid crystal layer is almost identical at any position in the film thickness direction. It is also feasible to provide an orientation wherein in the vicinity of one of the layer's surfaces the director is generally parallel to said surface, and as the opposite surface of the layer is approached, the director gradually changes, exhibiting a homeotropic orientation or an oriented state close thereto (splay configuration). Both a tilt orientation wherein the angle between the director and a projection of the director to a plane of the layer is constant at any point in the layer thickness direction, and an orientation wherein the said angle changes continuously in the layer thickness direction, are included in the scope of the pretilt orientation as referred to herein.

In a preferred embodiment, the present luminescent object comprises at least one layer of the aligned polymer containing oriented photoluminescent material, wherein the top surface of said layer coincides with or extends parallel to the top surface of the luminescent object. Such a luminescent object can be employed to concentrate incident optical radiation in a highly efficient manner.

The present luminescent object may comprise one or more layers comprising aligned polymer and oriented photoluminescent material. The use of several such layers offers the advantage that each of the layers can be optimised to absorb a particular bandwidth of optical radiation so that the overall film is capable of absorbing and concentrating a wide spectrum of optical radiation. The use of several layers also allows different polymers to be used in each layer as dictated by the preferences of individual photoluminescent dyes or the necessity of achieving specific tilt-alignments.

The photoluminescent material employed in the luminescent object may suitably have been mixed into the aligned polymer by doping the aligned polymer with the oriented photoluminescent material. Alternatively, the oriented photoluminescent material can be covalently bonded to the aligned polymer. In accordance with yet another suitable embodiment of the invention, the oriented photoluminescent material is a mesogenic group of the aligned polymer.

The oriented photoluminescent material in the present object may consist of a single photoluminescent component or it may comprise a mixture of photoluminescent components. It can be advantageous to employ a combination of photoluminescent components that each absorb optical radiation of different wavelengths. Thus, by selecting a suitable combination of photoluminescent components it can be ensured that the photoluminescent material contained in the present object absorbs a wide band of optical radiation, e.g. a major part of the solar radiation spectrum. In case the present object contains a plurality of layers, it may be advantageous to apply different photoluminescent materials in different layers. Thus, the performance of the present object in terms of light concentrating efficiency may be maximised. Naturally, if a combination of photoluminescent components is used, care must be taken to ensure that there is little or no overlap between the wavelengths at which this combination of photoluminescent components emits and absorbs radiation or, in case there is strong overlap, the combination should act as a cascade, meaning that radiation emitted by one photoluminescent component and absorbed by another component will cause the latter component to luminesce.

The oriented photoluminescent material employed in the luminescent object of the present invention preferably has a dichroic ratio of at least 2.0, more preferably of at least 3.0, most preferably of at least 5.0. In a planar orientation, dichroic photoluminescent material will absorb one linear polarisation direction of optical radiation to a substantially greater extent than the other ones.

Dichroic photoluminescent materials are particularly suitable for use in the present luminescent object. According to a preferred embodiment, the oriented photoluminescent material comprises organic and/or polymeric photoluminescent dyes. As used herein, the term "photoluminescent dye" means a dye which is a molecule that colours by itself, and thus absorbs light in the visible spectrum and possibly in the ultraviolet spectrum (wavelengths ranging from 100 to 800 nanometers), but which, in contrast with a standard dye, converts the absorbed energy into fluorescent light of a longer wavelength emitted primarily in the visible region of the spectrum. The photoluminescent dyes should possess a high quantum efficiency, good stability, and be highly purified. The dyes are usually present in a concentration of from $10^{-1}$ to $10^{-5}$ Molar. Typical examples of organic photoluminescent dyes that can suitably be employed in accordance with the present invention include, but are not restricted to, substituted pyrans (such as DCM), coumarins (such as Coumarin 30), rhodamines (such as Rhodamine B), BASF® Lumogen™ series, perylene derivatives, Exciton® LDS series, Nile Blue, Nile Red, DODCI, oxazines, pyridines, the 'styryl' series (Lambdachrome®), dioxazines, naphthalimides, thiazines, and stilbenes.

It is an essential aspect of the present invention that the oriented photoluminescent material is immobilised within an aligned polymer matrix. An object based on liquid crystalline polymer and containing a photoluminescent material can be aligned in several ways. In the case of liquid crystalline polymers it is often preferred to align a reactive liquid crystalline monomer and subsequently polymerize the monomer as discussed previously. This procedure is usually adopted because liquid crystalline monomers easily orient (in contrast to most liquid crystalline polymers).

The surface of the object is usually provided with an orientation layer which induces the proper alignment of the liquid crystal monomer/polymer. Some possible orientation layers are:

a. Polyimide alignment layers (buffed, rubbed or non-buffed, non-rubbed) are conventionally used to generate aligned liquid crystalline polymers with a planar or homeotropic alignment and/or with a specific pretilt. Typical examples are Optimer A1 1051, (ex JSR Micro) for planar alignment and 1211 polyimide varnish (ex. Nissan Chemical) for homeotropic alignment:

b. So called linear photopolymerizable materials (LPP) can be used as an alignment layer with a well-defined pretilt (see for example Staralign™, Vantico AG, Basel, CH)

Other techniques for the alignment of liquid crystals include:

a. Recording with a sharp or blunt stylus, oblique evaporation or sputtering of $SiO_2$, glancing angle deposition of inorganics, Langmuir-Blodgett deposited copper phthalocyanines doped polymethacrylate layers, and diamond-like carbon thin film layers (see for example references: Varghese et al (2004) Appl. Phys. Lett. 85, 230; Motohiro, T. and Taga, Y. (1990) Thin Solid Films 185, 137; Castellano, J. A. (1984) 4, 763; Robbie, K. et al (1999) Nature 399, 764, Lu, R. et al (1997) Phys. Lett. A 231, 449, Hwang, J-Y et al (2002) Jpn. J. Appl. Phys. 41, L654).

b. Alignment inducing surfactants, e.g. silanes, higher alcohols (e.g. n-dodecanol), and the like can be used to further tune the alignment of the liquid crystals.

c. By adding an alignment inducing dopant to the liquid crystalline polymer.

d. By applying mechanical drawing, flow, magnetic, electric poling field to the object.

e. By aligning polymers with smectic-A orientation through passing the object over heated rollers. The resulting shear deformation causes the mesogenic groups to become oriented.

f. By aligning liquid crystals by using reactive mesogens that attain smectic-C orientation by a (proper) heat treatment followed by initiating the polymerization reaction of the mesogens to trap the system in the smectic-C orientation.

Techniques that are particularly suitable for preparing a luminescent object comprising an aligned polymer having a pretilt of 30-80° are described in Hwang, Z. and Rosenblatt, C. Appl. Phys. Lett. 86, 011908, Lu, M. Jpn. J. Appl. Phys. 43, 8156, Lee, F. K. et al Appl. Phys. Lett. 85, 5556, The Staralign™ linearly photopolymerizable polymer system (Vantico AG), Varghese, S. et al. Appl. Phys. Lett. 85, 230, and Sinha, G. P. et al. Appl. Phys. Lett. 79, 2543. These publications are incorporated herein by reference.

The benefits of the present invention are particularly pronounced in luminescent polymeric objects, notably flat objects, in which the aligned polymer is aligned at a pretilt angle of less than 85°, preferably of less than 80°. Preferably, the pretilt angle is 10-89°, more preferably 10-85°, even more preferably 15-85°; more preferably 30-80°; preferably in the range of 30-70°, more preferably in the range 35-65° and most preferably in the range of 40-60°.

In particular when used in flat luminescent objects in combination with a waveguide, it is advantageous to employ aligned polymer at a pretilt-angle within the range of 10-89°, more preferably 10-85°, even more preferably 15-85°, more preferably in the range of 30-80°; preferably in the range of 30-70°, more preferably in the range 35-65° and most preferably in the range of 40-60°. The application of such a pretilt-angle enables highly efficient in-coupling of the emitted radiation into the waveguide. As explained herein before the benefits of the present invention result from the alignment of the photoluminescent material. The alignment of the photoluminescent material is achieved by immobilising the photoluminescent material within an aligned polymer matrix. The prevailing orientation of the photoluminescent material within such an aligned polymer matrix coincides with the alignment of said polymer matrix. It will be understood therefore that the preferred orientation angles for the photoluminescent material are the same as those mentioned above in relation to the aligned polymer.

In case the present luminescent object is a non-flat object, in particular if said object is an optical fibre, in an embodiment a pretilt angle of more than 50°, especially of more than 70° can be advantageous. Most preferably, in case of the present object is an optical fibre, the pretilt angle exceeds 80°. However, in another yet more preferred embodiment, the pretilt angle is in the range of 30-70°, more preferably in the range 35-65° and most preferably in the range of 40-60°.

The photoluminescent material employed in accordance with the invention typically emits optical radiation with a wavelength in the range of 100 nm to 2500 nm. Preferably, the photoluminescent material emits radiation in the range of 250-1500 nm, more preferably in the range of 400-1000 nm. For many applications an optimum photoluminescent material has a wide absorption range covering most of the solar spectrum as well as a narrow emission range having a somewhat longer wavelength. Thus, the photoluminescent material absorbs incoming solar radiation and emits it at another wavelength. The photoluminescent material employed in the present object typically has an absorption curve with an absorption maximum below 800 nm, preferably below 700 nm, and most preferably below 600 nm. According to a particularly preferred embodiment, the object absorbs light between 500 and 600 nm and emits light at a longer wavelength.

The level of alignment of the photoluminescent material within a planar object can suitably be defined in terms of the order parameter. The order parameter is defined as:

$$S=(A_{//}-A_\perp)/(A_{//}+2A_\perp)$$

Wherein $A_{//}$ denotes amount absorption by the sample of light with electric vector parallel to the alignment direction, $A_\perp$ the absorption by the sample of light with electric vector perpendicular to the alignment direction, and S the average orientation of the absorption moment in the fixed laboratory frame. Reference: Van Gurp, M. And Levine, Y. K., J. Chem. Phys. 90, 4095 (1989).

The photoluminescent material contained in the present object, preferably, exhibits an order parameter of at least 0.5, more preferably of at least 0.6, most preferably of at least 0.7.

The efficacy with which the present luminescent polymeric object may be employed in e.g. LSC-systems is critically dependent on the level of (re-)absorption of emitted light within the same object. According to a particularly preferred embodiment, the absorption maxima and emission maxima of the photoluminescent material contained within a discrete aligned polymer matrix, e.g. a layer, differ by at least 30 nm, preferably by at least 50 nm, more preferably by at least 100 nm.

The luminescent object according to the invention advantageously takes the shape of a film, a layer, a fibre, a ribbon, or woven. The thickness of such film, layer, fibre, ribbon or woven may vary depending on the intended application. Typically, said thickness will be in the range of 0.1-500 μm, preferably in the range of 5-50 μm.

The luminescent object advantageously comprises two or more stacked layers of aligned polymer containing oriented photoluminescent material. In accordance with one particular embodiment each aligned polymer layer contains a different photoluminescent material. Advantageously, these photoluminescent materials exhibit different absorption maxima. In accordance with another embodiment, the pretilt angle of the aligned polymer in the respective aligned polymer layers changes from layer to layer. This arrangement enables further optimisation of the efficiency with which incident radiations can be converted into photoluminescent radiation and subsequently be transported, especially through a separate waveguide. In yet another embodiment, each aligned polymer layer contains a different aligned polymer. The use of stacked layers of different aligned polymers is particularly advantageous in combination with the application of different photoluminescent materials in each of the aligned polymer layers and/or in combination with the use of aligned polymer layers that exhibit different pretilt angles. The luminescent object of the present invention may advantageously be applied onto e.g. windows, especially if these windows have been coupled to a photovoltaic device or if they are optically coupled to a source of internal lighting. By fixating the present luminescent object onto such a window (or a building element with a similar function), the window effectively becomes a waveguide that concentrates the electromagnetic radiation that is emitted by the luminescent layer. As will be explained below, in these applications it is highly desirable that the luminescent object is transparent to at least a fraction (e.g. across a bandwidth of at least 100 nm) of the visible light spectrum, especially the part of the visible light spectrum that is needed for photosynthesis.

A particularly advantageous embodiment of the invention relates to a luminescent object in the form of an optical laminate or an optical fibre, comprising at least one aligned polymer layer containing the oriented photoluminescent material and a waveguide that is optically coupled to the aligned polymer layer, wherein the refractive index of the waveguide, $n_w$, is such that $n_w \geq n_o - 0.005$, wherein $n_o$ is the ordinary refractive index of the aligned polymer. According to an even more preferred embodiment $n_w \geq n_o$, preferably $n_w > n_o$. This advantageously promotes containment of the light in the waveguide and decrease escape from light for instance back to the luminescent layer.

The optical laminates according to the present invention may suitably be employed to concentrate incident optical radiation. Radiation incident on the laminate is absorbed and re-emitted by the luminescent aligned polymer layer. This re-emitted radiation is coupled into the waveguide and guided by internal reflection along the waveguide to an outlet surface. The re-emitted radiation may exit the outlet surface, allowing the outlet surface to function as a light source. Alternatively, at the outlet surface the re-emitted radiation may be coupled into a device, such as a photovoltaic device, that will convert the optical radiation into another form of energy.

The optical fibres according to the invention may be laterally excited by optical radiation, following which emitted radiation will be transported to the ends of the fibre. The fibres of the present invention may advantageously be employed for concentrating optical radiation and/or for transmitting optical information.

Because the optical laminates and fibres according to the invention will re-emit radiation in response to incident radiation, these laminates and fibres may suitably be used to convey optical information, especially optical binary information. Since, however, the level of emitted radiation correlates to the intensity of incident radiation, the present optical laminates and fibres may also be used to convey analogue information.

According to yet another preferred embodiment the refractive index of the waveguide is between the ordinary and the extraordinary refractive indices of the aligned polymer layer. The refractive index of the waveguide typically is at least 1.4. Preferably the refractive index of the waveguide is within the range of 1.4-1.8, more preferably within the range of 1.4-1.7. The application of a waveguide with a high refractive index, especially relative to the refractive index of the luminescent film, ensures that the optical path of the emitted radiation within the luminescent film is reduced as the emitted radiation is efficiently coupled into the waveguide. In order to ensure that the emitted light is efficiently coupled into the waveguide it is furthermore advantageous for the surface of the luminescent aligned polymer layer and the surface of the waveguide to be adjacently joined together. The aligned polymer layer and waveguide may suitably be joined by means of an adhesive, provided the adhesive is largely transparent to the emitted radiation.

The luminescent aligned polymer layer within the optical laminate or fibre typically has a thickness of 0.1-500 μm, preferably of 5-50 μm. The waveguide typically has a thickness of 0.05-50 mm, preferably of 0.1-10 mm. In case the waveguide constitutes the core of an optical fibre of the present invention, the aforementioned ranges are applicable to the diameter of the waveguide.

The optical laminates and fibres of the present invention may suitably be produced from flexible, elastic materials. The flexible laminates and fibres so obtained may, for example, be produced as rolls or can be applied onto curved surfaces. The present invention also encompasses fibres and laminates that are relatively rigid, e.g. because they make use of a glass layer or core.

The present optical laminates and fibres can be manufactured in many different ways well-known in the art. The laminates may be produced by first providing one layer (film), e.g. the waveguide, followed by in situ creation of the other layers, e.g. by in situ polymerisation or hardening. Alternatively, the individual layers may be pre-manufactured individually and subsequently be combined into a single laminate, optionally using adhesives and/or other bonding techniques. Naturally, it is also possible to employ combinations of these techniques. Similar approaches can be used in the manufacture of the optical fibres of the present invention, except that in the case of fibres the layering process will start with providing the core of the optical fibre.

Suitable materials for the transparent waveguide are largely transparent for the emitted radiation that is to be conveyed through the waveguide. Suitable materials include transparent polymers, glass, transparent ceramics and combinations thereof. Preferably the transparent waveguide is made of a transparent polymer which may be thermosetting or thermoplastic. These polymers may be (semi-)crystalline or amorphous. Suitable polymers include polymethyl methacrylates, polystyrene, polycarbonate, cyclic olefin copolymers, polyethylene terephthalate, polyether sulphone, crosslinked acrylates, epoxies, urethane, silicone rubbers as well as combinations and copolymers of these polymers.

The optical laminate of the present invention may suitably take the shape of a flat planar plate. However, since the functionality of the optical laminate is not essentially dependent on the form of the laminate, also non-planar shapes are encompassed by the present invention.

The efficiency with which the optical laminates and fibres of the present invention are capable of concentrating incident optical radiation is dependent, amongst others, on the efficiency of emitted radiation trapping. This parameter can be influenced favourably by applying one or more additional layers that will reflect electromagnetic radiation that is emitted by the photoluminescent material. In a particular advantageous embodiment such reflective layers are largely transparent to the optical radiation that is absorbed by the photoluminescent material, meaning that these one or more layers function as a wavelength-selective mirror. The aforementioned wavelength-selective mirror can suitably be positioned as a separate layer anywhere between the luminescent layer and the surface that is meant to receive incident optical radiation. The wavelength-selective mirror may also advantageously be applied on the opposite side of the luminescent layer, in particular if it is desirable that some of the incident optical radiation is transmitted by the optical laminate or optical fibre. The wavelength-selective mirrors need to be largely transparent to radiation that is capable of exciting the photoluminescent material and at the same time the additional layers should effectively reflect the radiation emitted by said photoluminescent material.

In order to enjoy full advantage from the wavelength-selective mirror said mirror should cover at least 80% of one side of the luminescent layer or at least 80% of the exterior surface of the luminescent core. Furthermore, it is preferred to employ a relatively thin wavelength-selective mirror. Typically, the thickness of the wavelength-selective mirror does not exceed 100 μm, preferably it does not exceed 20 μm. Usually, the thickness of the aforementioned mirror will exceed 5 μm. It is noted that the wavelength-selective mirror of the present invention may suitably comprise two or more layers that together function as a wavelength selective mirror, e.g. a polymeric stack or a combination of cholesteric layers.

In a preferred embodiment of the invention this objective is realised by providing a luminescent object as defined herein before, additionally comprising a wavelength-selective mirror that is at least 50%, preferably at least 60%, more preferably at least 70% and most preferably at least 90% transparent to light absorbed by the photoluminescent materials and that is at least 50%, preferably at least 60% and most preferably at least 70% reflective to radiation that is emitted by the photoluminescent material. The wavelength-selective mirror may advantageously comprise a polymeric wavelength selective mirror and/or a polarization selective mirror.

The efficiency with which the present object concentrates radiation emitted by the photoluminescent material critically depends on the efficiency with which the wavelength-selective mirror reflects said radiation. Typically, the wavelength-selective mirror exhibits a maximum reflectivity of at least 50%, preferably of at least 60%, more preferably of at least 70% for optical radiation with a wavelength within the range of 500-2000 nm, preferably within the range of 600-2000 nm, and most preferably within the range of 630-1500 nm.

Likewise, and in particular if the wavelength-selective mirror is positioned as a separate layer anywhere between the luminescent layer/core and the surface that is meant to receive incident optical radiation, it is important that high-energetic radiation that is capable of exciting the photoluminescent material is transmitted by said mirror with high efficiency. Accordingly, the wavelength-selective mirror preferably exhibits a maximum transmittance of at least 60%, preferably of at least 70% for optical radiation with a wavelength within the range of 100-600 nm, preferably within the range of 250-700 nm, and even more preferably within the range of 350-800 nm.

Since the wavelength of radiation emitted by the photoluminescent material will inevitably exceed the wavelength of the radiation absorbed by the same material, it is preferred that the maximum of reflectivity occurs at a wavelength that exceeds the transmittance maximum, preferably by at least 30 nm, more preferably by at least 50 nm, even more preferably by at least 100 nm.

In an advantageous embodiment, the wavelength-selective mirror comprises a polarization selective mirror which is at least 50%, preferably at least 60%, more preferably at least 70% and most preferably at least 90% transparent to light absorbed by the photoluminescent material and that is at least 50%, preferably at least 60%, more preferably at least 70% reflective to circular or linear polarized radiation with the appropriate polarisation. Such an advantageous arrangement may be realised by employing polymeric stack layers and/or cholesteric layers.

The present luminescent object may advantageously contain a wavelength-selective mirror that comprises a cholesteric layer of chiral nematic polymer. In an even more preferred embodiment the polymeric wavelength-selective mirror comprises a first cholesteric layer reflecting right-handed circularly polarized light and a second cholesteric layer reflecting left-handed circularly polarized light, wherein a luminescent aligned polymer layer is sandwiched between the cholesteric layers and a waveguide or wherein a waveguide is sandwiched between the cholesteric layers and a luminescent aligned polymer layer. Preferably, the luminescent aligned polymer layer is sandwiched between the adjacent cholesteric layers and the waveguide. Cholesteric layers are capable of effectively reflecting a narrow band of circularly polarised radiation. Depending on the helical orientation of the cholesteric layer the layer will reflect either right- or left-circularly polarised radiation. By employing two cholesteric layers with opposite helical orientations, both right- and left-circularly polarised light will be reflected effectively.

The present luminescent object may also advantageously contain a wavelength-selective mirror that comprises one or more cholesteric layer(s) of chiral nematic polymer. Preferably, the polymeric wavelength-selective mirror comprises one or more layers selected from the group consisting of a cholesteric layer reflecting right-handed circularly polarized light and a cholesteric layer reflecting left-handed circularly polarized light. The luminescent aligned polymer layer may be sandwiched between the cholesteric layer(s) and the waveguide or the waveguide may be sandwiched between the cholesteric layer(s) and the luminescent aligned polymer layer. Preferably, the luminescent aligned polymer layer is sandwiched between the adjacent cholesteric layers and the waveguide.

In specific variants, the polymeric wavelength-selective mirror comprises one or more cholesteric layer(s) reflecting right-handed circularly polarized light or one or more cholesteric layer(s) reflecting left-handed circularly polarized light or comprises both one or more cholesteric layer(s) reflecting right-handed circularly polarized light and one or more cholesteric layer(s) reflecting left-handed circularly polarized light. A "simple" right- and left-handed two layer system may for instance only reflect a 75 nm bandwidth of light. It is possible to broaden the band, but in the art this appears not to be simple. According to the invention, it may advantageously be easier to broaden the band of wavelengths reflected by layering successive right-handed cholesterics on top of each other, followed by left-handeds on top of each other, or vice versa, or any combination of right- and left-handed layers. It is also conceivable to use only one handedness of cholesterics for the whole sample, i.e. for instance 2-5 left handed layers or 2-5 right handed layers. The invention is not restricted to a 2-layer system.

A chiral substance mixed with a nematic material induces a helical twist transforming the material into a chiral nematic material, which is synonymous to a cholesteric material. The cholesteric pitch of the chiral nematic material can be varied over a rather large range with comparative ease. The pitch induced by the chiral substance is, in a first approximation, inversely proportional to the concentration of the chiral material used. The constant of proportionality of the this relation is called the helical twisting power (HTP) of the chiral substance and defined by the equation:

$$HTP = 1/(c \cdot P)$$

wherein c is the concentration of the chiral substance and P is the induced helical pitch.

Optically active compounds that are capable of inducing a helical structure are generally referred to as "chiral dopant". Many chiral dopants have been synthesised, and typical examples thereof include compounds represented by the following structure: 2,2-dimethyl-4,5-diphenyl-1,3-Dioxolane

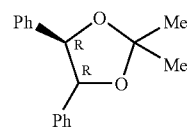 [SMILES: CC1(C)OC(c2ccccc2)[C@@H](c2ccccc2)O1]

ZLI 811, Benzoic acid, 4-hexyl-, 4-[[(1-methylheptyl)oxy]carbonyl]phenyl ester (9CI)

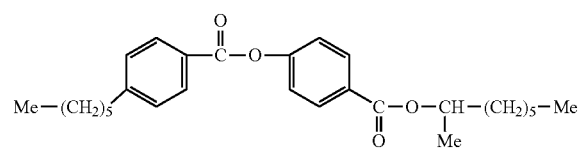

The cholesteric layer or combination of cholesteric layers advantageously reflects optical radiation emitted by the luminescent aligned polymer layer and is largely transparent to optical radiation with a wavelength in the range of 350-600 nm, preferably of 250-700 nm and most preferably of 100-800 nm.

In another embodiment, the present luminescent object additionally comprises a wavelength-selective mirror in the form of polymeric stack layer that is strongly reflective to radiation that is emitted by the photoluminescent material. More particularly, the polymeric polarization selective mirror comprises a first polymeric stack layer reflecting one plane of polarized light and a second polymeric stack layer reflecting the opposite plane of polarized light, wherein a luminescent aligned polymer layer is sandwiched between the polymeric stack layers and a waveguide or wherein a waveguide is sandwiched between the polymeric stack layers and a luminescent aligned polymer layer.

Polymeric stack layers are capable of selectively reflecting optical radiation within a certain wavelength range. Polymeric stack layers are also referred to as multilayer reflectors and are used to partition portions of the electromagnetic spectra between reflection and transmission. Polymeric stack layers typically employ a number of layers of at least two different materials within an optical stack. The different materials have refractive indices along at least one in-plane axis of the stack that are sufficiently different to substantially reflect light at the interface of the layers. Polymeric stack layers can be constructed to reflect optical radiation incident at normal and/or oblique angles of incidence.

Preferably, the polymeric stack layers employed in the present luminescent object have been designed to reflect optical radiation above 600 nm, more preferably above 700 nm and most preferably above 800 nm. In a preferred embodiment, the luminescent aligned polymer layer is sandwiched between the polymeric stack layer and a waveguide. Polymeric stack layers that are employed as wavelength-selective mirrors in accordance with the present invention may suitably be prepared using the methodology described in U.S. Pat. No. 6,157,490 and Weber, M. F. et al. Science 287, 2451, which are incorporated herein by reference.

In order to prevent radiation from escaping the present luminescent object it can be advantageous to employ a mirror that is reflective to a broad range of optical radiation, said mirror being located at the bottom surface of the object, meaning that incident radiation that passes through the luminescent aligned polymer layer as well as optical radiation emitted by the same layer in the direction of the mirror will be reflected by said mirror. More particularly, this embodiment provides a luminescent object as defined herein before, wherein the bottom surface is covered with a mirror that is at least 80% reflective for wavelengths of 450-1200 nm, preferably at least 90% reflective for wavelengths of 450-1200 nm.

Radiation losses from the present luminescent object may be further minimised by applying mirrors to the sides of the object that are not supposed to transmit radiation to e.g. a photovoltaic device. Accordingly, in a preferred embodiment at least one of the sides of the object is covered with a mirror that is at least 80% reflective for wavelengths of 450-1200 nm, preferably at least 90% reflective for wavelengths 450-1200 nm. More preferably at least two sides and most preferably at least three sides of the object are covered with such a mirror.

For certain applications it may be advantageous if the present luminescent object is largely transparent for optical radiation within a particular wavelength range. According to a particularly preferred embodiment, the luminescent object is predominantly transparent for optical radiation in the range of 400-500 nm and/or 600-700 nm. Thus, the luminescent object may suitably be applied onto or used instead of e.g. windows or greenhouse panes as visible light that is used in photosynthesis will pass through the luminescent object whilst optical radiation of other wavelengths may be concentrated and transported effectively by the same object. According to a very preferred embodiment, the luminescent object is predominantly transparent for optical radiation in both the range of 400-500 nm and 600-700 nm. Thus, the present invention also encompasses a greenhouse comprising one or more panes covered with an luminescent object as defined herein before that is transparent for optical radiation in the range of 400-500 and/or 600-700 nm in combination with one or more photovoltaic cells capable of converting optical radiation to electrical energy, said one or more photovoltaic cells being optically coupled to the luminescent object.

A further embodiment of the invention relates to a photovoltaic device comprising an electromagnetic radiation collection medium containing luminescent object as defined herein before and a photovoltaic cell capable of converting optical radiation to electrical energy which is optically coupled to a waveguide comprised by the luminescent object, said photovoltaic cell preferably being arranged at the edge of the waveguide, or near the edge of the waveguide on the top or bottom surface of the waveguide layer.

Another embodiment of the invention concerns a fluorescent light activated display comprising a luminescent object as defined above.

Yet another embodiment of the present invention relates to a room lighting system comprising a luminescent object as defined above, wherein the system is arranged in such a way that incident solar light is converted to room lighting by said luminescent object.

Another aspect of the invention relates to the use of a luminescent object as defined herein before for concentrating incident optical radiation. This use of the luminescent object encompasses e.g. self-supporting luminescent films as well as e.g. optical laminates and optical fibres that comprise aligned polymer layers containing oriented photoluminescent material.

In an embodiment, there is provided a LSC system without an opaque (i.e. for instance without a rear mirror, as described herein) rear surface for implementation in a greenhouse. Preferably, in a further variant, the wavelength regions of the spectra not used (for growth) by the plants are collected and converted into electricity via the photovoltaic. In yet another variant, the light of longer wavelength (i.e. the converted light), is collected and via a light pipe used to re-illuminate the plants at a wavelength the plants use for growth. For instance, the LSC system may be applied to collect and convert green light, which is in general not used by plants, and convert the light into red light (or blue light, in case upconverter materials are used). The generated red light may be used by the plants in the greenhouse.

Figure 14:
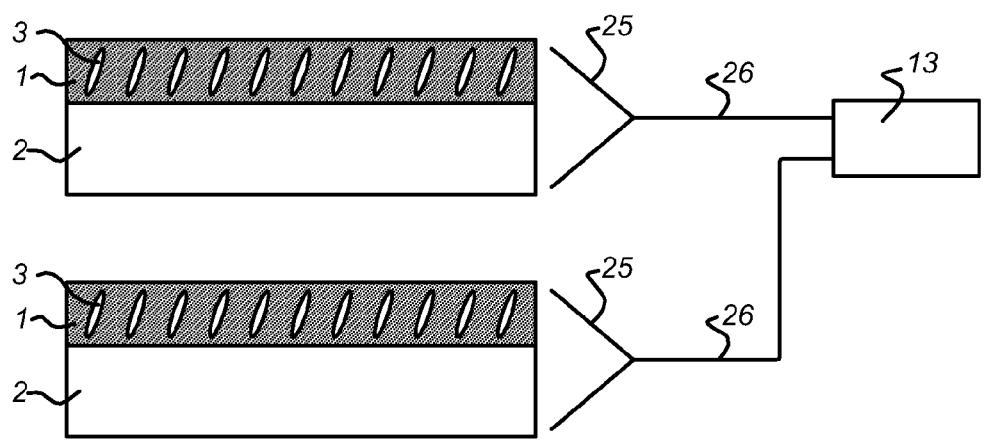
FIG. 14 schematically depicts an embodiment of a device according to the invention comprising a number (i.e. here 2 or more) LSC's and a photovoltaic cell 13. Optical coupling may be achieved via waveguides (for instance optical fibres) 26. The radiation from waveguides 2 may optionally be collimated into waveguides 26 by collimators 25.

In yet a further embodiment, LSC as fibres according to the invention could be woven into or onto clothing or other materials (clothes, sleeping bags, tents, et), and bundles of the fibres illuminating a photovoltaic or solar cell for electrical generation (see for instance also FIG. 14). The invention is also directed to such product as clothes, sleeping bags, tents, etc. (for instance with fibres of about 0.005 mm-10 cm, preferably about 0.5 mm-1.0 cm). A luminescent objects in the form of a laminate or sheet with an optical wave guide according to the invention can also be used to construct objects such as tent siding, and can be used for generation of electricity by a solar cell. The invention is also directed to such objects.

Further, for instance small scale consumer products, such as laptop covers, pens, watches, calculator covers, jewellery, hats, caps, etc. could contain sheets or fibres of the material designed for electrical generation by a solar cell.

It would also be possible to use the light output directly for visual effects rather than electrical generation (i.e. the application or object as above mentioned without a solar cell).

Further application of the invention may be, for instance, road signs or markers, to generate electricity, or to induce or enhance the visual safety effects of these signs, outdoor furniture that generates electricity or visual light effects, transparent, semi-transparent, or opaque roadside sound barriers that generate electricity or visual lighting effects, etc.

In a specific embodiment, extraterrestrial applications are included: 'solar sails' for spacecraft propulsion may be equipped with the LSC according to the invention, for simultaneously generation of electricity via PV cells irradiated by the LSC collected radiation (and optionally also direct irradiation by the sun) as well as propelling the craft.

Some specific embodiments of a solar cell and the LSC according to the invention are depicted in FIGS. 13a-13e. These figures are similar to FIG. 4 described above. Of course other configurations are possible, like for instance those depicted in FIGS. 2,3,5 and 6 (and 15a-c). These schematic drawings are only shown to illustrate possible constructions:

a. A solar cell 13 placed sideways, such that light from waveguide 2 is concentrated into solar cell or photovoltaic cell 13.
b. A solar cell 13 placed at the "bottom", for instance intercepting optional mirror layer 9, such that light from waveguide 2 is concentrated into solar cell or photovoltaic cell 13.
c. A solar cell 13 placed at the "top", for instance intercepting optional cholesteric layers 7 and 8, such that light from waveguide 2 is concentrated into solar cell or photovoltaic cell 13.
d. A solar cell 13 placed at the "top", for instance intercepting optional cholesteric layers 7 and 8 and luminescent layer 1, such that light from waveguide 2 is concentrated into solar cell or photovoltaic cell 13.
e. A solar cell 13 placed at the "bottom", for instance intercepting optional mirror layer 9 and waveguide 2, such that light from waveguide 2 is concentrated into solar cell or photovoltaic cell 13.

FIGS. 13a-13e also show the optional alignment layer 20, as described above (for instance a PI layer). Such alignment layers are known to the person skilled in the art.

Another embodiment is schematically shown in FIG. 14. Herein a number (especially two or more) of solar concentrators comprising the luminescent layer 1 and waveguide 2 are used to provide solar light to solar cell 13. For instance, the LSC can be as depicted in FIGS. 2-8. Light from the waveguide 2 may be transported to solar cell 13 via waveguides (fibres) 26. Optionally, the light concentrated in waveguide 2 may be collimated by collimators 25 into waveguides 26.

As will be clear to the person skilled in the art, the schematic embodiments of FIGS. 13a-13e do also include embodiments wherein a number of solar cells 13 are incorporated in the combination of luminescent layer 1 and waveguide 2. For instance, in case luminescent layer 1 and waveguide 2 (and optional other layers, as described above) are in the form of a flat or substantial flat laminate, at least part of one or more of the edges of the waveguide 2 laminate may be optically coupled to a number of solar cells or PV cells 13. Hence, in an embodiment there is provided a window comprising the luminescent object according to the invention and a photovoltaic cell (or more than one, as will be clear to the person skilled in the art) capable of converting optical radiation to electrical energy which is optically coupled to the luminescent object.

Further, one LSC comprising a luminescent layer 1 and waveguide 2 according to the invention may be coupled to more than 1 fibre 26 and may thus provide light to more than one PV cells 13.

In yet another embodiment, the LSC comprising the luminescent layer 1 and waveguide 2 being essentially a thin sheet of plastic film, like a transparency slide, with or without an adhesive backing. The film would contain aligned dye molecules, and a preferably selectively-reflective layer (for instance this may be cholesteric layers 9a and/or 9b). This film could then be mounted by the end-user on any window. Pre-placed within the window frame will be the photovoltaic. Thus, the window will become the waveguide 2, transporting the light to the solar cell(s) 13 in the frame. The film may be disposable: that is, it may be peeled off the window to allow natural sunlight back into the room, if desired.

In an embodiment, the terms "optically coupled" or "coupled optically" also include the optical coupling of objects of which surfaces are not adjacent, but between which a distance can be present. For instance, the photovoltaic cell 13 is preferably adjacent to waveguide 2, but in an embodiment, there may be some space in between. Such space may for instance be filled with air or comprise a vacuum, or even polymer. Polymer may for instance be used for attaching a PV cell to the waveguide, as in an embodiment a sheet of high-index thermosetting plastic may be applied to aide in extraction of light from the waveguide and introduction of this light into the PV. For example, putting a low-refractive index polymer between the metallic mirror on the bottom and the dye layer or waveguide seems to increase the output of the system.

The invention is also directed to embodiments wherein the luminescent object comprises next to an aligned polymeric layer (with aligned photoluminescent material) further comprises one or more layers comprising unoriented photoluminescent material.

In an embodiment, the luminescent object further comprises at least one wavelength selective and polarisation selective reflecting cholesteric layer (shown as layers 7 or 8). The luminescent object may also comprise (a stack of) two or more wavelength selective and polarisation selective reflecting cholesteric layers. For instance, the luminescent object may comprise a right and left handed cholesteric layer, but may also comprise two right handed cholesteric layers, or a stack of right, right and left or right, left right handed cholesteric layers as wavelength selective layers. Such an embodiment is schematically indicated in FIG. 15c, with a wavelength selective mirror comprising instead of a right handed and a left handed cholesteric layers 7 and 8, respectively, comprises for instance a stack of three layers 8 (being either all left-handed or all right-handed (see also FIG. 6)). As will be clear to the person skilled in the art, this embodiment may also be applicable to other embodiments, as for instance schematically shown in the other figures. To give an example, also the fibre of FIGS. 7 and 8 may comprise instead of layers 7 and 8, comprise one or more cholesteric layer(s) reflecting right-handed circularly polarized light or one or more cholesteric layer(s) reflecting left-handed circularly polarized light or comprises both one or more cholesteric layer(s) reflecting right-handed circularly polarized light and one or more cholesteric layer(s) reflecting left-handed circularly polarized light.

Figure 4:
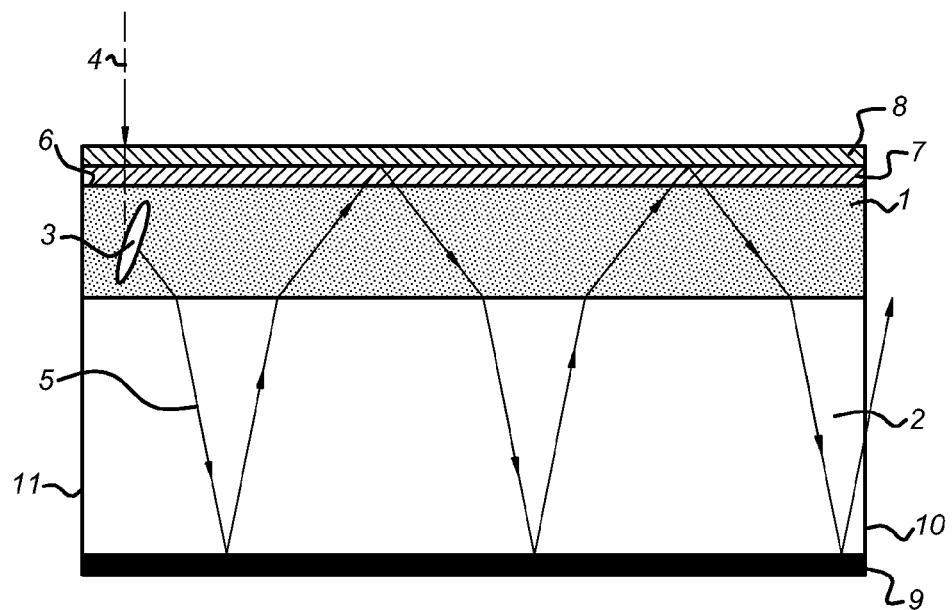
FIG. 4 depicts a cross-section of an optical laminate comprising a luminescent layer 1 and a waveguide 2. The laminate furthermore comprises two wavelength selective and polarisation selective reflecting cholesteric layers 7 and 8, as well as a reflective mirror layer 9. Optical radiation, represented by arrows 4, enters the laminate through the left handed cholesteric layer 8 and the right handed cholesteric layer 7 and reaches the luminescent layer 1. Within the luminescent layer 1 photoluminescent molecules 3, which have been aligned at a pretilt, are excited by the incident radiation 4 and emit optical radiation depicted by the arrows 5. A large fraction of the emitted radiation 5 enters the waveguide 2 where it is internally reflected until it reaches the exit 10 or 11. The cholesteric layers 7 and 8 ensure that not more than a tiny fraction of the emitted radiation 5 will escape the laminate as together these wavelength-selective mirrors 7 and 8 effectively reflect emitted radiation that re-enters the luminescent layer 1. The mirror layer 9 reflects optical radiation 4 and emitted radiation 5 back into the waveguide.
Figure 5:
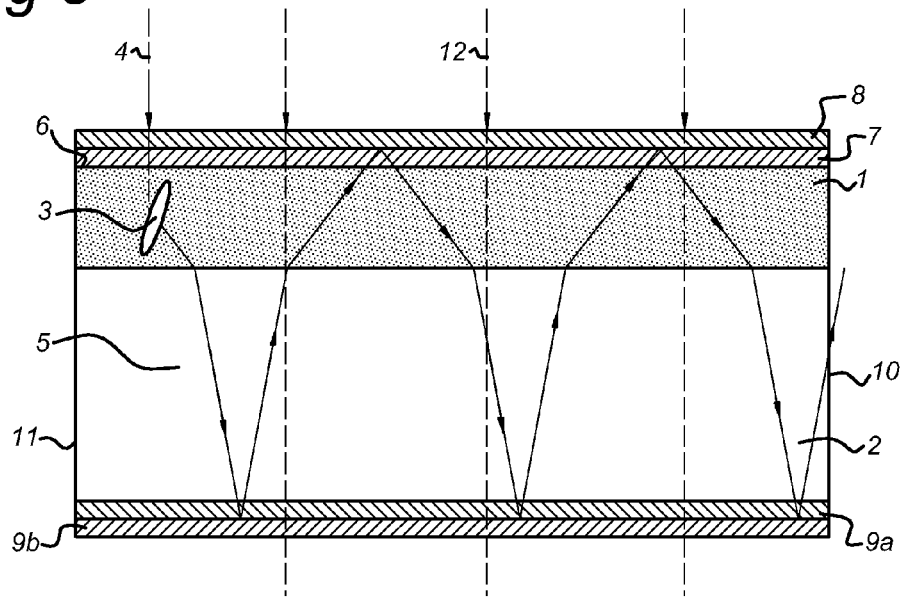
FIG. 5 depicts a cross-section of an optical laminate that is identical to the one shown in FIG. 4, except that the mirror layer 9 is replaced by two cholesteric layers 9a and 9b. By employing a combination of cholesteric layers 7, 8, 9a and 9b that is largely reflective to the emitted radiation 5 but transparent to optical radiation 12 that is not absorbed by the photoluminescent dye molecules 3, it can be ensured that optical radiation 12 will travel through the complete laminate. This particular laminate may advantageously be employed as a windowpane that selectively concentrates a fraction of the incident solar light whilst allowing the other fraction to travel through the pane. As mentioned above, instead of two layers 9a and 9b, more or less layers can be used.
Figure 6:
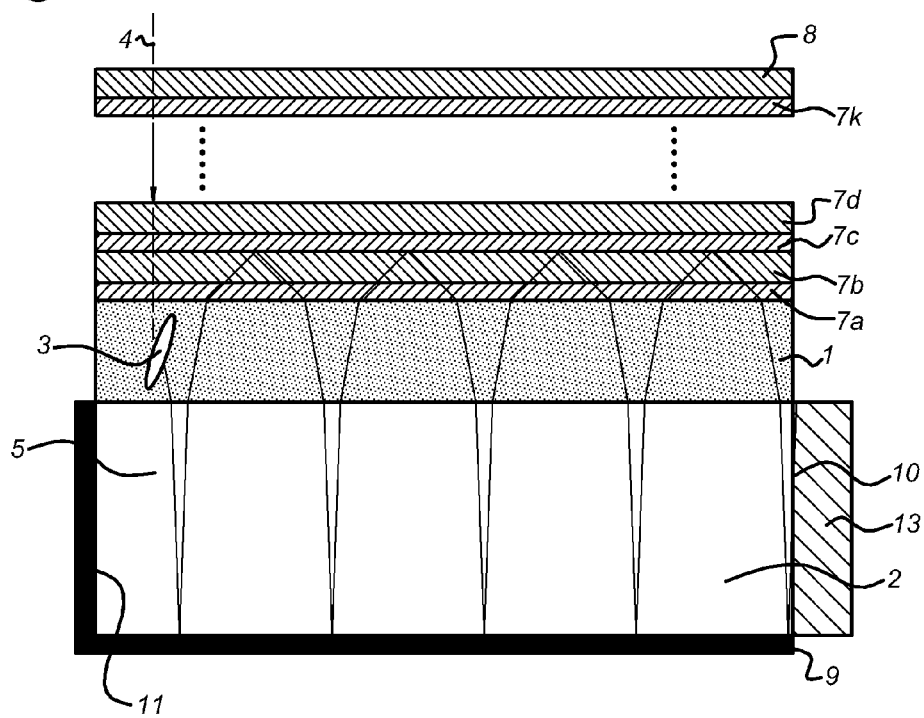
FIG. 6 depicts a cross-section of an optical laminate comprising a luminescent layer 1 and a waveguide 2. The laminate furthermore comprises a polymeric stack layer 7 comprising a plurality of sub-layers 7a to 7k, as well as a reflective mirror layer 9. Optical radiation, represented by arrows 4, enters the laminate through the polymeric stack layer 7 and reaches the luminescent layer 1. Within the luminescent layer 1 tilt-aligned photoluminescent molecules 3 are excited by the incident radiation 4 and emit optical radiation depicted by the arrows 5. A large fraction of the emitted radiation 5 enters the waveguide 2 where it is internally reflected until it reaches the exit 10. The polymeric stack layer 7 ensures that not more than a tiny fraction of the emitted radiation 5 will escape the optical laminate as this wavelength-selective mirror 7 effectively reflects emitted radiation that re-enters the luminescent layer 1. The mirror layer 9 reflects optical radiation 4 and emitted radiation 5 back into the waveguide 2. Three sides of the optical laminate, including exit 11 are also provided with a reflective mirror coating 9 that reflects both optical radiation 4 and emitted radiation 5 back into the waveguide 2. Thus, effectively the only exit for emitted radiation from the optical laminate is the exit 10 which is optically coupled to a photovoltaic cell 13.
Figure 7:
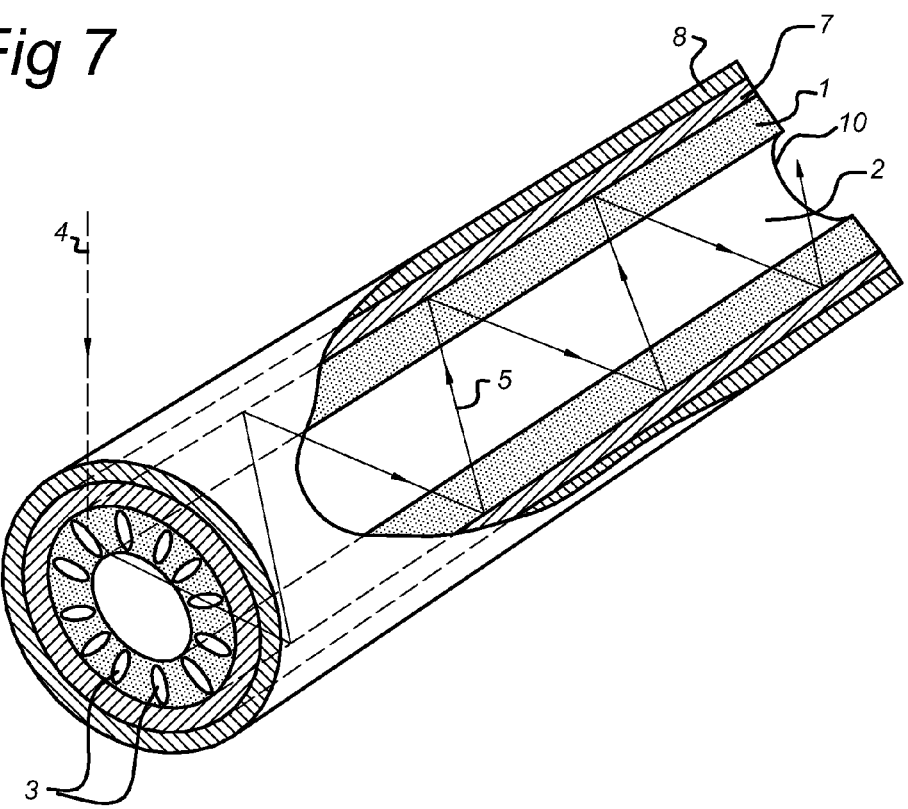
FIG. 7 depicts a cross section of an optical fibre comprising a luminescent layer 1 and a waveguide core 2. The laminate furthermore comprises two wavelength selective and polarisation selective reflecting cholesteric layers 7 and 8. Optical radiation, represented by arrows 4, enters the laminate through the left handed cholesteric layer 8 and the right handed cholesteric layer 7 and reaches the luminescent layer 1. Within the luminescent layer 1 pretilt aligned photoluminescent molecules 3 are excited by the incident radiation 4 and emit optical radiation depicted by the arrows 5. A large fraction of the emitted radiation 5 enters the waveguide 2 where it is internally reflected until it reaches the exit 10. The cholesteric layers 7 and 8 ensure that not more than a tiny fraction of the emitted radiation 5 will escape the optical fibre as together these wavelength-selective mirrors 7 and 8 effectively reflect emitted radiation that re-enters the luminescent layer 1.
Figure 8:
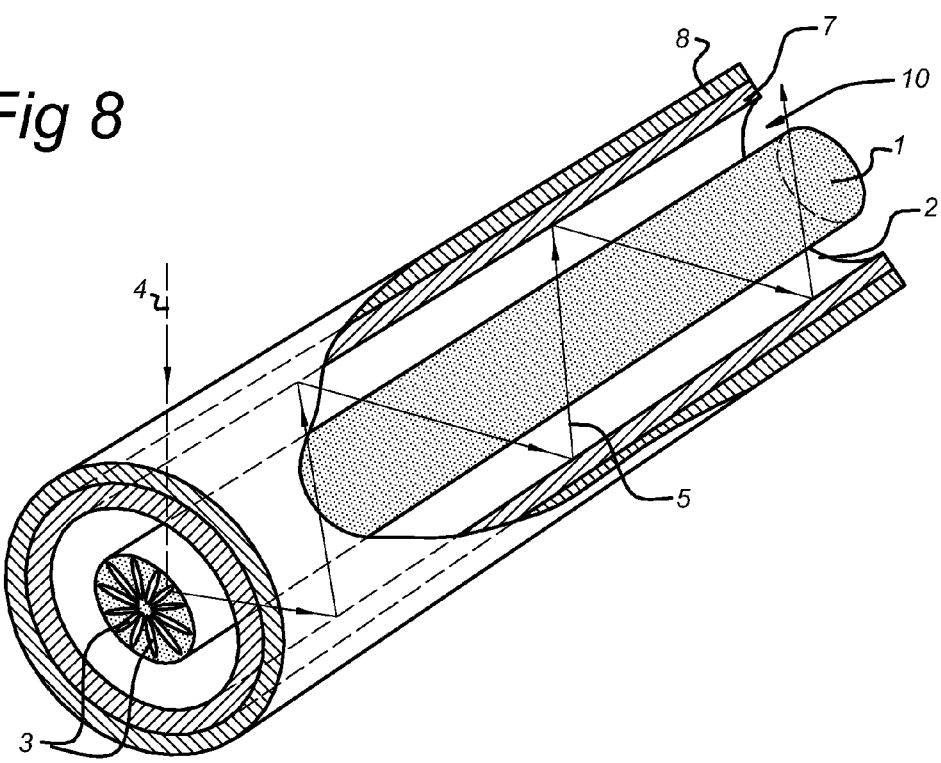
FIG. 8 depicts a cross section of an optical fibre comprising a luminescent core 1 and a waveguide 2. The laminate furthermore comprises two wavelength selective and polarisation selective reflecting cholesteric layers 7 and 8. Optical radiation, represented by arrows 4, enters the laminate through the left handed cholesteric layer 8 and the right handed cholesteric layer 7 and reaches the luminescent core 1. Within the luminescent layer 1 pretilt aligned photoluminescent molecules 3 are excited by the incident radiation 4 and emit optical radiation depicted by the arrows 5. A large fraction of the emitted radiation 5 enters the waveguide 2 where it is internally reflected until it reaches the exit 10. The cholesteric layers 7 and 8 ensure that not more than a tiny fraction of the emitted radiation 5 will escape the optical fibre as together these wavelength-selective mirrors 7 and 8 effectively reflect emitted radiation that hits the outside wall of the waveguide 2.
Figure 13A:
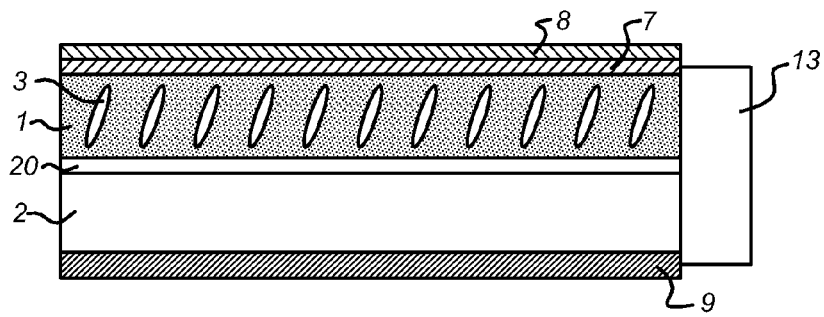
FIGS. 13a-13e schematically depicts embodiments of devices according to the invention comprising an LSC and a photovoltaic cell 13. Instead of mirror 9, also one or more cholesteric layers may be used (see also FIG. 5).
Figure 13B:
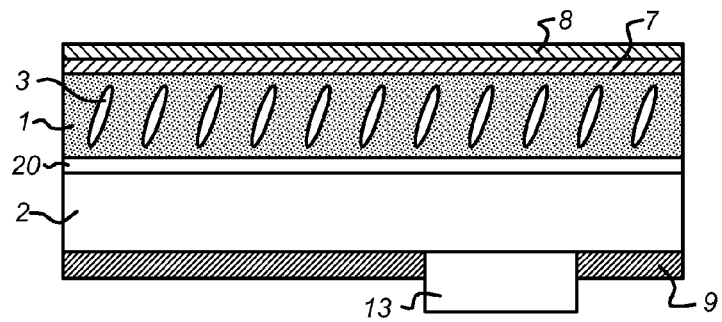
Figure 13C:
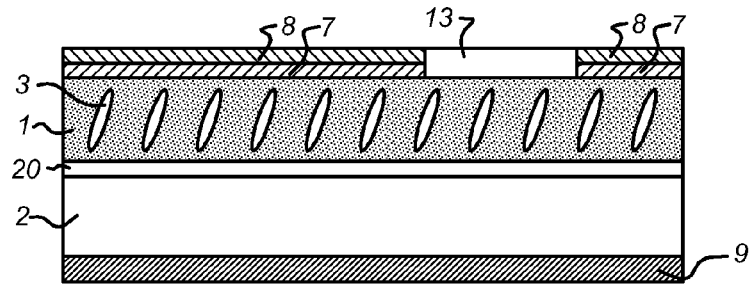
Figure 13D:
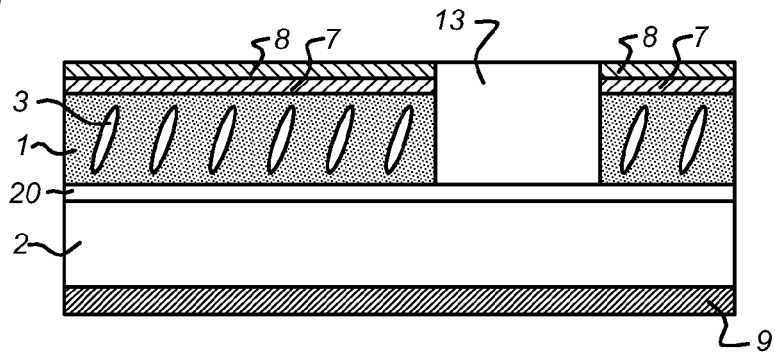
Figure 13E:
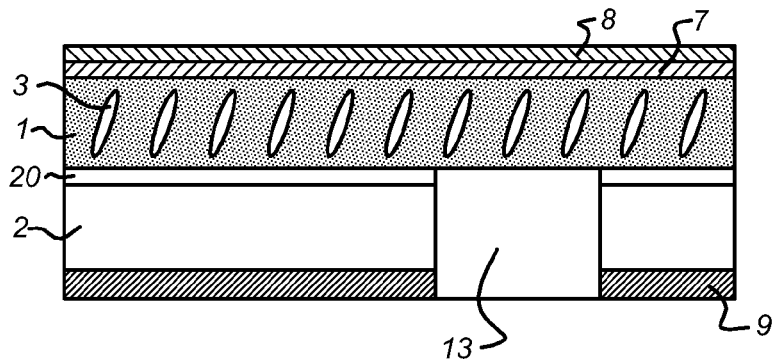
Figure 15A:
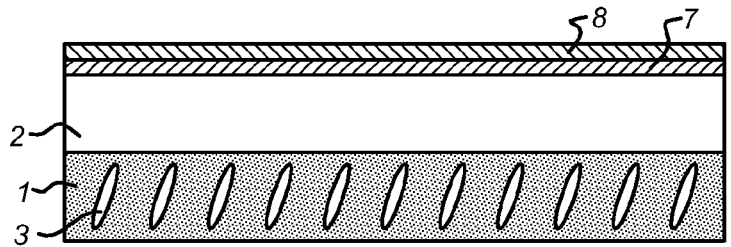
FIGS. 15a (mirror 9 or one or more cholesteric layers not included) and 15b schematically show variants on FIGS. 4 and 13b (but may also be applied as variants to other embodiments).
Figure 15B:
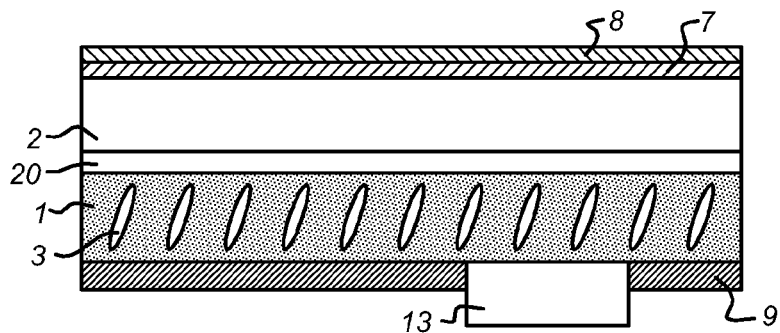
FIG. 15c schematically shows another variant on FIG. 4 (but may also be applied as variant to other embodiments).
Figure 15C:
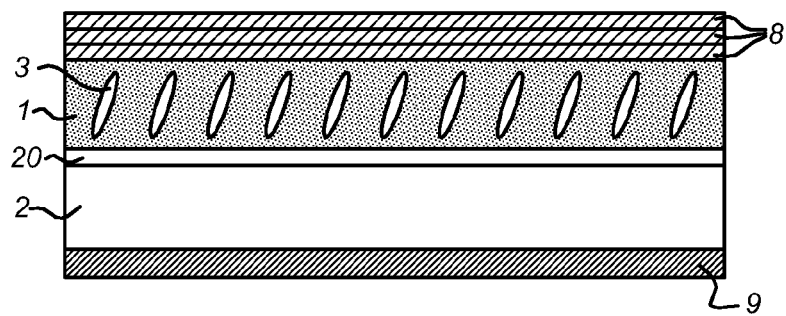

As mentioned above, the position of luminescent layer 1 and waveguide 2 may be exchanged (see for instance also FIGS. 7 and 8), which is schematically shown in f FIGS. 15*a* and 15*b*, which are variants on FIGS. 4 and 13*b*, but may also be applied as variants to other embodiments.

In yet a further embodiment, instead of or in addition to down conversion photoluminescent material (i.e. material that absorbs light at a shorter wavelength than it emits light, for instance a green to red converter), the luminescent object of the invention may also comprise upconversion materials (i.e. material that absorbs light at a shorter wavelength than it emits light).

The invention is further illustrated by means of the following examples.

EXAMPLES

Example 1

Application of a Homeotropically Aligned Photoluminescent Polymer Coating

A homeotropic dye-doped liquid crystal mixture was applied to a clean 30 mm×30 mm×1 mm glass slide. The liquid crystal mixture was prepared by mixing an ethanol solution which contained 1 wt. % Irgacure 184 (ex Ciba Chemicals) and 1 wt. % Coumarin 30 (ex Aldrich Chemicals) together with a solution containing 50 wt. % RMM77 monomer and a 50 wt. % xylene in a weight ratio of 1:1. RMM77 (Merck) is a nematic homeotropic reactive liquid crystal from which the main components are the liquid crystals RM82 and RM257 (both Merck) and a homeotropic dopant. The mixture was stirred at 80° C. for 2 hours until all ethanol was evaporated. The xylene was evaporated by applying the mixture on the preheated waveguides (80° C.) for 10 minutes. After evaporation of the xylene a wet film was created with a 24 µm Meyer rod, resulting in an approximately 10 µm thick film. The samples were UV cured ($\lambda$=365 nm) under a $N_2$ atmosphere for 4 minutes at room temperature and then for 4 minutes at 110° C.

Application of an Isotropic Photoluminescent Polymer Coating

An isotropic sample prepared in the exact manner as the homeotropic sample, but using a RM82 and RM257 mixture not containing the homeotropic dopant.

Measurements

Figure 9:
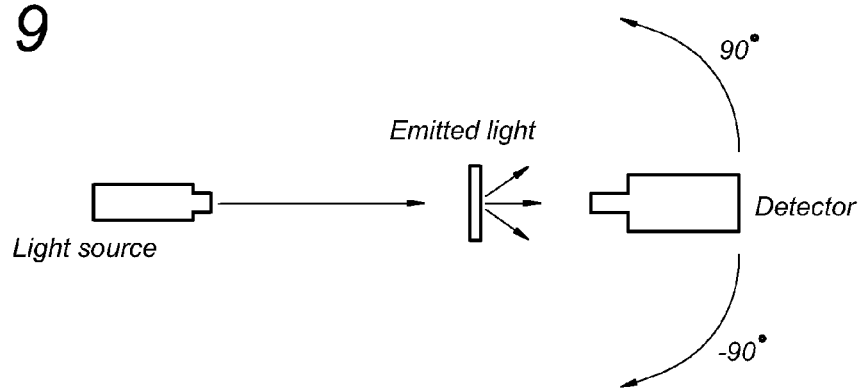
FIG. 9 schematically depicts a measurement setup as used herein.

The measurement of light output by the above samples was carried out by an Autronic DMS 703 (Melchers GmbH) together with a CCD-Spect-2 (CCD-Camera). The LSC samples were placed in a custom-made sample holder and exposed to a collimated light source. Light output from the surface of the sample was measured through an angular distribution of 0-90° in steps of 1 degree. The peak emission was determined and compared to the peak emission from the surface of an isotropic sample prepared in the exact manner as described above, but using a RM82 and RM257 mixture not containing the homeotropic dopant. A sketch of the measurement setup is shown in FIG. 9.

Figure 10:
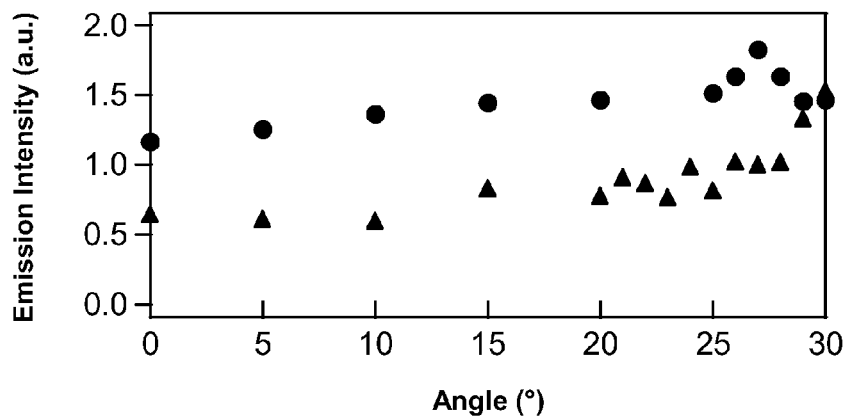
FIG. 10 presents results of example 1.

The result was the homeotropic sample almost halved the amount of light lost through the sample, thereby increasing the amount of light directed into the waveguide. FIG. 10 depicts the result of this experiment. In this figure, light intensity emitted from the surface is given as a function of emission angle for two samples, one with an isotropically aligned dye (circles) and one with the homeotropically aligned dye (triangles). Note that for the waveguide used in this experiment, all light above 33° was trapped by total internal reflection, and thus could not escape through the surface. The waveguide herein comprises the glass plate, having dimensions of 30×30×1 mm (l×w×h).

Example 2

Example 1 was repeated except that first a polyimide alignment layer (Optimer A1 1051, ex JSR Micro) was spin cast onto the glass slide at 2000 rpm/s at an acceleration of 2500 rpm/S2 for 45 sec. After this the substrate was heated for 1.5 hours at 180° C. under vacuum. The alignment layer was rubbed with a velvet cloth to induce a planar alignment of the applied cholesteric liquid crystal. Next the homeotropic dye-doped liquid crystal mixture (this time using the dye DCM (4-Dicyanmethylene-2-methyl-6-(p-dimethylamino styryl)-4H-pyran (ex Aldrich Chemicals)) was applied to the opposite side of the slide as described in Example 1.

A 120 nm silver mirror was sputtered on top of the dye layer using a conventional sputter coater (Emitech K575X sputter coater, at a current of 65 mA for 2.5 min).

A cholesteric mixture was made by mixing 3.9 wt. % of a right-handed chiral dopant LC756 (ex BASF), 1 wt. % Irgacure 184 (ex Ciba Chemicals), 1 wt. % surfactant and 94 wt. % reactive liquid crystal host RM257 (Merck) dissolved in xylene (55 wt. % solids, 45 wt. % solvent). Subsequently the mixture was stirred at 80° C. for 3 hours.

The cholesteric mixture was spin cast on the polyimide alignment layer at 2000 rpm for 45 sec. with an acceleration speed of 2500 rpm/s. After spin casting the substrate was heated at 80° C. for about 1 min. to evaporate the solvent and allow the surfactant to improve the alignment of the chiral nematic liquid crystal. Afterwards, photopolymerization was carried out at room temperature by irradiation for 10 min using a UV-lamp (peak wavelength 365 nm) in a $N_2$-environment. A second, left-handed cholesteric could then be easily applied to the surface using a similar process. Finally, a layer of reflective silver paint was applied to three edges of the waveguide, resulting in the final device.

Figure 11:
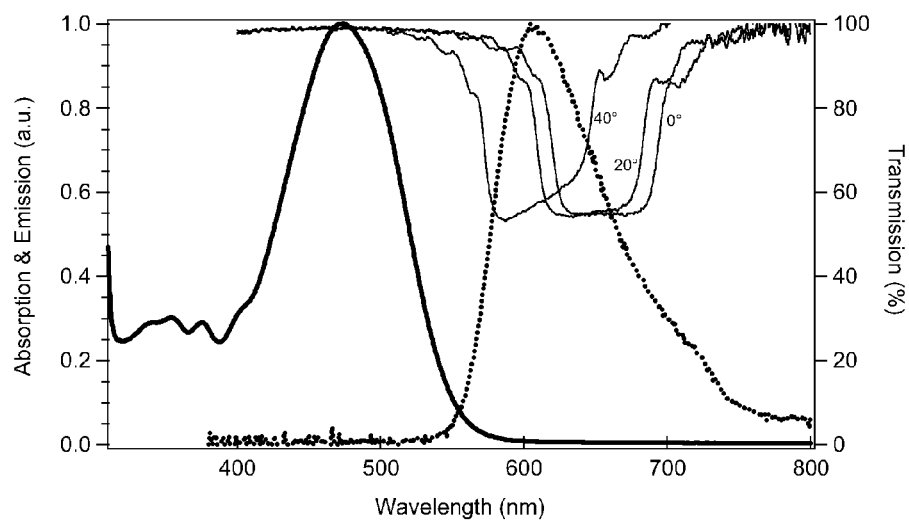
FIG. 11 presents results of example 2.

The above procedure was repeated two times using 4.2 and 4.5 wt. % of the right-handed chiral dopant LC756. FIG. 11 depicts the transmission spectra of the cholesteric layer containing 3.9 wt. % of the right-handed chiral dopant exposed to unpolarized light at three angles of incidence, i.e. 0°, 20° and 40°. The transmission spectra for the cholesteric layers containing 4.2 wt. % or 4.5 wt. % of the chiral dopant are essentially identical except that the reflection band for the layers containing 4.2 wt. % and 4.5 wt. % occur at significantly shorter wavelengths. To be more precise, the reflection band for normal light incidence in the 4.2 wt. % sample is blue-shifted by about 32 nm and the reflection band for the 4.5 wt. % sample by about 83 nm.

Figure 12:
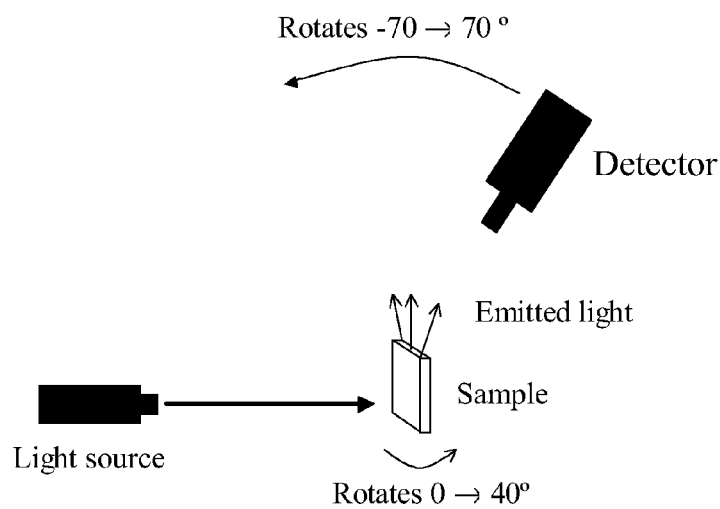
FIG. 12 schematically depicts a measurement setup as used herein.

The light output of the LSC samples was determined using an Autronic DMS 703 (Melchers GmbH) together with a CCD-Spect-2 (CCD-Camera). The LSC samples were placed in a custom-made sample holder and exposed to a roughly uniform light source located at a distance of about 11 cm. Light output from a small area (about 0.8 cm) of the emission edge of the sample was measured through an angular distribution of −50-50° in steps of 1 degree. The total emission was determined by integrating the spectra over all measured wavelengths (350-800 nm) and all angles. Measurements along the length of the sample edge indicate little variation with position, but for these experiments emission measurement position was fixed. All measurements for single samples with multiple layers were taken on the same day. A sketch of the measurement setup is shown in FIG. 12.

|        | Amount of chiral | Angle of incidence | | |
|--------|------------------|--------|--------|--------|
| Sample | dopant used      | 0°     | 20°    | 40°    |
| A      | 3.9 wt. %        | 17%    | 14%    | 11%    |
| B      | 4.2 wt. %        | 4%     | 0.6%   | −8%    |
| C      | 4.5 wt. %        | 1%     | −6%    | −14%   |

As may be clearly seen, the application of the single cholesteric layer (Sample A) improved light output at least 11-17%, and by application of a second, left-handed layer this improvement will be on the order of 20-35%. The results obtained for samples B and C are reduced because the reflection band of the cholesteric layer partly coincides with the absorption peak of the photoluminescent material and/or only partly coincides with the emission peak of said photoluminescent material.

Herein, the alignment layer was used to align the cholesteric layers.

This experiment was repeated, but using a pmma substrate in place of a glass substrate. A polyimide alignment layer (Optimer A1 1051, ex JSR Micro) was spin cast on it at 2000 rpm/s at an acceleration of 2500 rpm/s$^2$ for 45 sec. After this the substrate was heated for 1.5 hours at 100° C. in air. The alignment layer was rubbed with a velvet cloth to induce a planar alignment of the applied cholesteric liquid crystal.

To the opposite side of the slide, an isotropic dye-doped mixture was applied. The mixture was prepared by mixing 1 wt. % Irgacure 184 (ex Ciba Chemicals) and 1 wt. % DCM (4-Dicyanmethylene-2-methyl-6-(p-dimethylaminostyryl)-4H-pyran (ex Aldrich Chemicals) together with a solution containing 75 wt. % dipentaerythritol pentaacrylate (Aldrich) and 25 w % ethanol. A roughly 10 μm thick film was produced by spin coating at 4000 rpm for 45 seconds (2500 rpm/sec ramp speed). The sample was UV cured (λ=365 nm) under a N$_2$ atmosphere for 10 minutes at room temperature.

A 120 nm silver mirror was sputtered on top of the dye layer using a conventional sputter coater (Emitech K575X sputter coater, at a current of 65 mA for 2.5 min).

A cholesteric mixture was made by mixing 4.1 wt. % of a right-handed chiral dopant LC756 (ex BASF), 1 wt. % Irgacure 184 (ex Ciba Chemicals), 1 wt. % surfactant and 94 wt. % reactive liquid crystal host RM257 (Merck) dissolved in xylene (55 wt. % solids, 45 wt. % solvent). Subsequently the mixture was stirred at 80° C. for 3 hours.

The cholesteric mixture was spin cast on the polyimide alignment layer at 2000 rpm for 45 sec. with an acceleration speed of 2500 rpm/s. After spin casting the substrate was heated at 80° C. for about 1 min. to evaporate the solvent and allow the surfactant to improve the alignment of the chiral nematic liquid crystal. Afterwards, photopolymerization was carried out at room temperature by irradiation for 10 min using a UV-lamp (peak wavelength 365 nm) in a N$_2$-environment. A second, left-handed cholesteric could then be easily applied to the surface using a similar process. Finally, a layer of reflective silver paint was applied to three edges of the waveguide, resulting in the final device.

The light output of the LSC sample was determined using an Autronic DMS 703 (Melchers GmbH) together with a CCD-Spect-2 (CCD-Camera). The LSC samples were placed in a custom-made sample holder and exposed to a roughly uniform light source located at a distance of about 11 cm. Light output from a small area (about 0.8 cm$^2$) of the emission edge of the sample was measured through an angular distribution of −70-70° in steps of 1 degree. The total emission was determined by integrating the spectra over all measured wavelengths (350-800 nm) and all angles. For this experiment emission measurement position was fixed.

The sample with the single, right-handed cholesteric demonstrated a 34% increase in integrated light output for input light normal to the waveguide surface when compared to the integrated light output of the bare dye layer. When subsequently covered with the second, left-handed cholesteric the total integrated light output was determined to be 53% greater than from the dye layer alone for input light incident normal to the waveguide surface.

Example 3

Example 1 is repeated except that a liquid crystalline polymer is employed that is aligned at a tilt angle of around 30° using the procedure described by Sinha et al in Appl. Phys. Lett. (2001), 79 (16), 2543-2545.

Again the efficiency of the LSC is measured using the methodology described in Example 1. The results show that the efficiency of the LSC exceeds the efficiency of the LSCs described in example 1. This superior efficiency is believed to be associated with an improved incoupling of the emitted radiation into the waveguide.

Example 4

A tilted alignment of the dye molecules was also achieved in the following manner. A solution was made of a two polyimides: 4% Nissan G1211, a homeotropic polyimide, and 96% Nissan G130, a planar polyimide. This solution was spin cast on a 30×30×1 mm glass plate at 5000 rpm for 60 seconds, and cured in a vacuum oven for 90 minutes at 180° C. The polyimide was rubbed on a velvet cloth.

A mixture containing 1% of a perylene-based dye, 1% of the photoinitiator Irg 184 (Ciba chemicals) and 98% RM257 (Merck) dissolved in a 55:45 wt % ratio in xylene was spin cast on the polyimide alignment layers at 2000 rpm for 40 seconds, and placed on a hot plate at 80° to evaporate the solvent. This procedure resulted in a tilt-angle of the perylene-based dyes of about 15°.

The light output of the LSC sample was determined using an Autronic DMS 703 (Melchers GmbH) together with a CCD-Spect-2 (CCD-Camera). The LSC samples were placed in a custom-made sample holder and exposed to a roughly uniform light source located at a distance of about 11 cm. Light output from a small area (about 0.8 cm$^2$) of the emission edge of the sample was measured through an angular distribution of −70-70° in steps of 1 degree. The total emission was determined by integrating the spectra over all measured wavelengths (350-800 nm) and all angles. For this experiment emission measurement position was fixed. The total integrated light output of this sample was 10% higher than the output of a randomly oriented sample prepared in the same manner (which did not comprise a polyimide alignment layer).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A luminescent object comprising:
   a luminescent layer; and
   a waveguide, wherein the object is an optical laminate or an optical fiber coupled optically to the waveguide and comprises an aligned polymer that contains an oriented photoluminescent material, the oriented photoluminescent material comprising oriented photoluminescent molecules immobilized within the aligned polymer with a pretilt angle of 10-90° relative to the surface of the object;
   wherein the aligned polymer comprises mesogenic groups and the oriented photoluminescent molecules are aligned in essentially a same direction as the mesogenic groups of the aligned polymer.

2. The luminescent object according to claim 1, wherein the oriented photoluminescent material has a dichroic ratio of at least 2.0 in a planar cell.

3. The luminescent object according to claim 1, wherein the oriented photoluminescent material has a dichroic ratio of at least 3.0 in a planar cell.

4. The luminescent object according to claim 1, wherein the oriented photoluminescent material has a dichroic ratio of at least 5.0 in a planar cell.

5. The luminescent object according to claim 1, wherein the aligned polymer has a pretilt angle of 30-80°.

6. The luminescent object according to claim 1, wherein the aligned polymer has a pretilt angle of 30-70°.

7. The luminescent object according to claim 1, wherein the aligned polymer has a pretilt angle of 40-70°.

8. The luminescent object according to claim 7, wherein the aligned polymer has a pretilt angle of 40-60°.

9. The luminescent object according to claim 1, wherein the oriented photoluminescent material emits optical radiation in the range of 100-2500 nm.

10. The luminescent object according to claim 9, wherein the oriented photoluminescent material emits optical radiation in the range of 250-1500 nm.

11. The luminescent object according to claim 10, wherein the oriented photoluminescent material emits optical radiation in the range of 400-1000 nm.

12. The luminescent object according to claim 1, wherein the object comprises two or more stacked layers of aligned polymer comprising oriented photoluminescent material.

13. Luminescent object according to claim 12, wherein each aligned polymer layers contains a different photoluminescent material.

14. The luminescent object according to claim 12, wherein the pretilt angle of the aligned polymer in each aligned polymer layer changes from layer to layer.

15. The luminescent object according to claim 1, said object comprising a waveguide that is optically coupled to an aligned polymer layer containing the oriented photoluminescent material, wherein the refractive index of the waveguide (nw) is such that nw>n0−0.005, wherein n0 is the ordinary refractive index of the aligned polymer.

16. The luminescent object according to claim 15, wherein the refractive index of the waveguide is between the ordinary and extraordinary refractive indices of the aligned polymer layer.

17. The luminescent object according to claim 1 further comprising an inorganic or organic polymeric wavelength-selective mirror that is at least 50% transparent to light absorbed by the photoluminescent material and that is at least 50% reflective to non-polarized radiation that is emitted by the photoluminescent material.

18. The luminescent object according to claim 1 further comprising a wavelength-selective mirror, wherein the wavelength-selective mirror comprises a cholesteric layer of chiral nematic polymer.

19. The luminescent object according to claim 18, wherein the polymeric wavelength-selective mirror comprises:
   one or more cholesteric layer(s) reflecting right-handed circularly polarized light; or
   one or more cholesteric layer(s) reflecting left-handed circularly polarized light; or
   both one or more cholesteric layer(s) reflecting right-handed circularly polarized light and one or more cholesteric layer(s) reflecting left-handed circularly polarized light.

20. The luminescent object according to claim 1, wherein the object is predominantly transparent for optical radiation in the range of 400-500 nm, 600-700 nm, or both.

21. The luminescent object according to claim 1, wherein the object is an optical fiber comprising a luminescent layer and a waveguide core.

22. The luminescent object according to claim 1, wherein the object is an optical fiber comprising a luminescent core and a waveguide.

23. The luminescent object according to claim 1, wherein the waveguide does not comprise a fluorescent dye.

24. A photovoltaic device comprising:
   an electromagnetic radiation collection medium containing a luminescent object comprising:
   a luminescent layer; and
   a waveguide, wherein the object is an optical laminate or an optical fiber coupled optically to the waveguide and comprises an aligned polymer comprising mesogenic groups, wherein the aligned polymer contains an oriented photoluminescent material comprising oriented photoluminescent molecules immobilized within the aligned polymer with a pretilt angle of 10-90° relative to the surface of the object, wherein the oriented photoluminescent molecules are aligned in essentially a same direction as the mesogenic groups of the aligned polymer; and
   a photovoltaic cell capable of converting optical radiation to electrical energy which is optically coupled to the luminescent object.

25. A window comprising the photovoltaic device according to claim 24.

26. A fluorescent light activated display comprising a luminescent object comprising:
   a luminescent layer; and
   a waveguide, wherein the object is an optical laminate or an optical fiber coupled optically to the waveguide and comprises an aligned polymer comprising mesogenic groups, wherein the aligned polymer contains an oriented photoluminescent material comprising oriented photoluminescent molecules immobilized within the aligned polymer with a pretilt angle of 10-90° relative to the surface of the object, wherein the oriented photoluminescent molecules are aligned in essentially a same direction as the mesogenic groups of the aligned polymer.

27. A method of concentrating incident optical radiation comprising: administering of a luminescent object comprising:
- a luminescent layer; and
- a waveguide, wherein the object is an optical laminate or an optical fiber coupled optically to the waveguide and comprises an aligned polymer comprising mesogenic groups, wherein the aligned polymer contains an oriented photoluminescent material comprising oriented photoluminescent molecules immobilized within the aligned polymer with a pretilt angle of 10-90° relative to the surface of the object, wherein the oriented photoluminescent molecules are aligned in essentially a same direction as the mesogenic groups of the aligned polymer.

* * * * *